(12) United States Patent
Ogawa et al.

(10) Patent No.: US 12,295,202 B2
(45) Date of Patent: May 6, 2025

(54) OPTICAL FILM AND IMAGE DISPLAY DEVICE

(71) Applicant: DAI NIPPON PRINTING CO., LTD., Tokyo (JP)

(72) Inventors: Yoshimasa Ogawa, Tokyo (JP); Keisuke Ebisu, Tokyo (JP); Yousuke Kousaka, Tokyo (JP); Jun Sato, Tokyo (JP); Takahito Kawakami, Tokyo (JP); Atsuhiro Kobayashi, Tokyo (JP); Hiroki Matsushita, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 928 days.

(21) Appl. No.: 16/976,312

(22) PCT Filed: Feb. 27, 2019

(86) PCT No.: PCT/JP2019/007490
§ 371 (c)(1),
(2) Date: Aug. 27, 2020

(87) PCT Pub. No.: WO2019/168005
PCT Pub. Date: Sep. 6, 2019

(65) Prior Publication Data
US 2021/0050553 A1    Feb. 18, 2021

(30) Foreign Application Priority Data

Feb. 28, 2018   (JP) ................................. 2018-034675

(51) Int. Cl.
*G09G 5/00*    (2006.01)
*B32B 7/023*    (2019.01)
(Continued)

(52) U.S. Cl.
CPC ........... *H10K 50/844* (2023.02); *B32B 7/023* (2019.01); *B32B 27/08* (2013.01); *B32B 27/281* (2013.01);
(Continued)

(58) Field of Classification Search
CPC .... H10K 50/844; H10K 59/40; H10K 77/111; H10K 50/86; H10K 59/12;
(Continued)

(56) References Cited

U.S. PATENT DOCUMENTS

2016/0194448 A1    7/2016    Song et al.
2016/0239121 A1*   8/2016    Murakami ............ G06F 3/0443
(Continued)

FOREIGN PATENT DOCUMENTS

CN     108291996     7/2018
JP     2008-165040   7/2008
(Continued)

OTHER PUBLICATIONS

International Preliminary Report on Patentability, issued in the corresponding PCT Application No. PCT/JP2019/007490, dated Sep. 1, 2020, 16 pages (including translation).
(Continued)

*Primary Examiner* — Jennifer T Nguyen
(74) *Attorney, Agent, or Firm* — HSML P.C.

(57) ABSTRACT

Provided are a foldable optical film with excellent impact resistance and with capability to improve design quality, and an image display device including the same. An aspect of the present invention provides a foldable optical film 10 with a front surface 10A and a back surface 10B opposite to the front surface 10A, wherein optical film 10 includes a hard coat layer 12, a resin layer 13, and a decorative layer 14; the hard coat layer 12 is located closer to the front surface 10A than the resin layer 13 and the decorative layer 14 in the
(Continued)

optical film 10; and the resin layer 13 has a film thickness of 10 µm or more, and the resin layer 13 has a Martens hardness of 1 MPa or more and 100 MPa or less.

17 Claims, 6 Drawing Sheets

(51) Int. Cl.
*B32B 27/08* (2006.01)
*B32B 27/28* (2006.01)
*B32B 27/36* (2006.01)
*G02B 1/14* (2015.01)
*H10K 50/844* (2023.01)
*H10K 50/86* (2023.01)
*H10K 59/12* (2023.01)
*H10K 59/40* (2023.01)
*H10K 77/10* (2023.01)
*H10K 102/00* (2023.01)

(52) U.S. Cl.
CPC ............ *B32B 27/36* (2013.01); *G02B 1/14* (2015.01); *H10K 50/86* (2023.02); *H10K 59/12* (2023.02); *H10K 59/40* (2023.02); *H10K 77/111* (2023.02); *B32B 2255/10* (2013.01); *B32B 2255/26* (2013.01); *B32B 2255/28* (2013.01); *B32B 2307/42* (2013.01); *B32B 2457/206* (2013.01); *B32B 2551/00* (2013.01); *H10K 2102/311* (2023.02)

(58) Field of Classification Search
CPC .... H10K 2102/311; G02B 1/14; B32B 7/023; B32B 27/08; B32B 27/281; B32B 27/36; B32B 2255/10; B32B 2255/26; B32B 2255/28; B32B 2307/42; B32B 2457/206; B32B 2551/00

USPC ........................................................ 345/173
See application file for complete search history.

(56) References Cited

U.S. PATENT DOCUMENTS

| 2016/0306230 | A1  | 10/2016 | Yamada et al. |
| 2017/0276840 | A1* | 9/2017  | Horio ..................... B32B 3/30 |
| 2018/0248150 | A1* | 8/2018  | Oh ........................ H10K 50/86 |
| 2018/0329125 | A1  | 11/2018 | Hikita et al. |
| 2018/0370207 | A1* | 12/2018 | Nodono ................ B32B 27/06 |
| 2019/0346592 | A1* | 11/2019 | Nakazawa ............ G02B 1/14 |
| 2020/0144553 | A1* | 5/2020  | Ogasawara ........... B32B 27/32 |
| 2021/0109268 | A1* | 4/2021  | Inomata ........... C08F 220/1804 |

FOREIGN PATENT DOCUMENTS

| JP | 2009-132091   |   | 6/2009  |              |
| JP | 2010069702    | * | 4/2010  | ........... B32B 9/00 |
| JP | 2016-125063   |   | 7/2016  |              |
| KR | 10-2014-0029179 |   | 3/2014 |              |
| KR | 10-2014-0056072 |   | 5/2014 |              |
| WO | 2015/105058   |   | 7/2015  |              |
| WO | 2017/014198   |   | 1/2017  |              |
| WO | 2017/119391   |   | 7/2017  |              |
| WO | 2017/142035   |   | 8/2017  |              |
| WO | 2017/200042   |   | 11/2017 |              |
| WO | 2018/128171   |   | 7/2018  |              |

OTHER PUBLICATIONS

Korean Office Action, issued in the corresponding Korean patent application No. 10-2020-7025882, dated May 2, 2023, 15 pages (with machine translation).

International Search Report, issued in the corresponding PCT Application No. PCT/JP2019/007490, dated Jun. 4, 2019, 5 pages.

* cited by examiner

OPTICAL FILM AND IMAGE DISPLAY DEVICE

CROSS-REFERENCE TO RELATED APPLICATION

The present application enjoys the benefit of priority to the prior Japanese Patent Application No. 2018-34675 (filed on Feb. 28, 2018), the entire disclosure of which is incorporated herein by reference.

TECHNICAL FIELD

The present invention relates to an optical film and an image display device.

BACKGROUND ART

Image display devices have been known to be used in smartphones, tablet terminals, and the like, and foldable image display devices are currently in development. The front surface of an image display device may be composed of a glass cover. When a glass cover is used in an image display device and the image display device is deliberately folded, the glass cover is likely to be cracked because the glass cover has excellent hardness and poor foldability. Thus, it is contemplated using an optical film which comprises a light-transmitting base material and a hard coat layer and can be folded while keeping moderate hardness, instead of using a glass cover, in a foldable image display device (see, for example, Patent Document 1).

PRIOR ART DOCUMENTS

Patent Document

Patent Document 1: JP2016-125063A

SUMMARY OF THE INVENTION

An optical film used in such a foldable image display device is required to have impact resistance because the surface of the optical film may receive impacts. In this respect, when an impact force is applied from the front surface of an optical film, a depression formed on the front surface of the optical film may cause damage on some component (for example, a decorative layer) of the optical film or on a component (for example, a polarizing plate) located interior to the optical film in an image display device.

The depression on the surface of an optical film includes the depression attributed to the optical film itself and that attributed to an adhesive layer located interior to the optical film in an image display device. A "depression attributed to the optical film itself" refers to a depression formed by deformation of an optical film itself occurring when an impact force is applied to the surface of the optical film, while a "depression attributed to an adhesive layer" refers to a depression formed by deformation of an optical film that follows plastic deformation of an adhesive layer located interior to the optical film in an image display device, which occurs due to the softness of the adhesive layer, when an impact force is applied to the surface of the optical film.

Thus, excellent impact resistance is required for each optical film to prevent formation of depression attributed to the optical film itself and that attributed to an adhesive layer and of damage to components located interior to the optical film in an image display device upon impact on the surface of the optical film; however, such optical films with excellent impact resistance have not yet been obtained. In addition, some optical films are currently required to have a function to improve design quality of image display devices.

The present invention is designed to solve the above-mentioned problems. That is, an object of the present invention is to provide a foldable optical film exhibiting excellent impact resistance upon impact from the front surface and being capable of improving design quality, and an image display device comprising the same. Moreover, another object of the present invention is to provide an image display device exhibiting excellent impact resistance upon impact from the front surface.

The present invention includes the following inventions.

[1] An optical film with a front surface and a back surface opposite to the front surface, comprising: a hard coat layer, a resin layer, and a decorative layer, wherein the hard coat layer is located closer to the front surface than the resin layer and the decorative layer in the optical film; the resin layer has a film thickness of 10 μm or more; and the resin layer has a Martens hardness of 1 MPa or more and 100 MPa or less.

[2] The optical film according to [1], wherein the resin layer is provided closer to the front surface than the decorative layer in the optical film.

[3] The optical film according to [1] or [2], further comprising a light-transmitting base material.

[4] The optical film according to [3], wherein the light-transmitting base material is a base material containing a polyimide resin, a polyamide resin, or a combination thereof.

[5] The optical film according to [3] or [4], comprising the hard coat layer, the light-transmitting base material, the resin layer, and the decorative layer arranged in this order from the front surface to the back surface in the optical film.

[6] The optical film according to [3] or [4], comprising the hard coat layer, the resin layer, the light-transmitting base material, and the decorative layer arranged in this order from the front surface to the back surface in the optical film.

[7] The optical film according to [3] or [4], wherein the decorative layer is provided between the light-transmitting base material and the resin layer.

[8] The optical film according to any one of [1] to [7], wherein the resin layer has a film thickness of 10 μm or more and 500 μm or less.

[9] The optical film according to any one of [1] to [8], wherein no crack or break is formed in the optical film when the optical film is folded in a manner that leaves a gap of 30 mm between the opposite edges, and then unfolded, and the process is repeated one hundred thousand times.

[10] An image display device, comprising a display panel and the optical film according to any one of [1] to [9] placed on the observer's side of the display panel, wherein the front surface of the optical film is closer to the observer's side than the back surface of the optical film.

[11] The image display device according to [10], wherein the display panel is an organic light emitting diode panel.

[12] An image display device, comprising a display panel, a polarizing plate, and a foldable optical film arranged in this order toward the observer's side, wherein the optical film comprises a hard coat layer and a resin layer that is located closer to the polarizing plate than the hard coat layer, the resin layer has a film thickness of 10 μm or more, and the resin layer has a Martens hardness of 1 MPa or more and 100 MPa or less.

[13] The image display device according to [12], wherein the optical film further comprises a light-transmitting base material.

[14] The image display device according to [13], wherein the light-transmitting base material is a base material composed of a polyimide resin, a polyamide resin, or a combination thereof.

[15] The image display device according to [13] or [14], comprising the hard coat layer, the light-transmitting base material, and the resin layer arranged in this order toward the polarizing plate.

[16] The image display device according to [13] or [14], comprising the hard coat layer, the resin layer, and the light-transmitting base material arranged in this order toward the polarizing plate.

[17] The image display device according to any one of [12] to [16], wherein the resin layer has a film thickness of 10 μm or more and 500 μm or less.

[18] The image display device according to any one of [12] to [17], further comprising a light-transmitting film with an in-plane phase difference of 3,000 nm or more located closer to the observer's side than the polarizing plate.

[19] The image display device according to any one of [12] to [18], wherein no crack or break is formed in the optical film when the optical film is folded in a manner that leaves a gap of 30 mm between the opposite edges, and then unfolded, and the process is repeated one hundred thousand times.

[20] The image display device according to any one of [12] to [19], wherein the display panel is an organic light emitting diode panel.

An aspect of the present invention can provide an optical film exhibiting excellent foldability upon impact on the front surface and being capable of improving design quality, and an image display device comprising such an optical film. Moreover, another aspect of the present invention can provide an image display device exhibiting excellent impact resistance upon impact from the front surface.

DETAILED DESCRIPTION OF THE INVENTION

First Embodiment

An optical film and an image display device according to the first embodiment of the present invention will be described below with reference to the drawings. In this specification, the terms "film" and "sheet" are not distinguished from each other only on the basis of the difference of names. For example, the term "film" is thus used to refer inclusively to an element called "sheet." FIG. 1 shows a schematic diagram of the optical film according to the present embodiment, and FIG. 2 schematically illustrates the steps of the successive folding test, and FIGS. 3 to 6 show schematic diagrams of other optical films according to the present embodiment.

<<<Optical Film>>>

Figure 1:
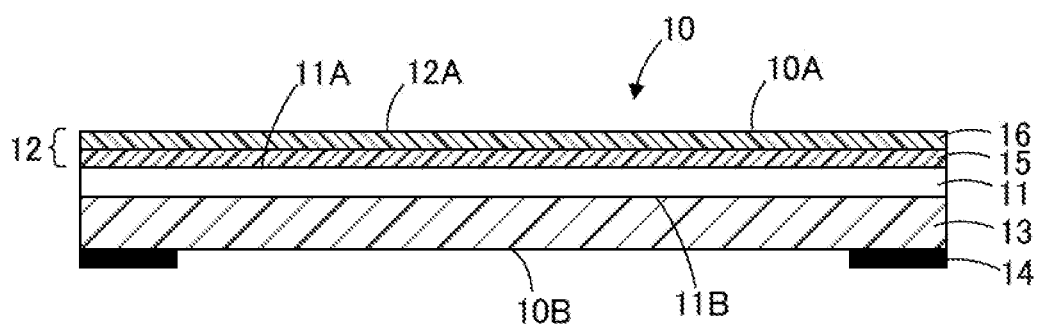
FIG. 1 shows a schematic diagram of an optical film according to the first embodiment.

An optical film 10 shown in FIG. 1 is foldable and light-transmitting. The term "light-transmitting" as used herein refers to a property that allows light transmission, including, for example, a total light transmittance of 50% or more, preferably 70% or more, more preferably 80% or more, particularly preferably 90% or more, at a position where no decorative layer exists. The term "light-transmitting" does not necessarily refer to transparency and may refer to translucency.

The optical film 10 has a front surface 10A and a back surface 10B opposite to the front surface 10A. Additionally, the optical film 10 comprises a light-transmitting base material 11, a hard coat layer 12, a resin layer 13, and a decorative layer 14. In the optical film 10, the hard coat layer 12 is provided closer to the front surface 10A of the optical film 10 than the light-transmitting base material 11, the resin layer 13, and the decorative layer 14; additionally, the resin layer 13 is provided closer to the front surface 10A of the optical film 10 than the decorative layer 14. Specifically, the optical film 10 comprises the hard coat layer 12, the light-transmitting base material 11, the resin layer 13, and the decorative layer 14 arranged in this order from the front surface 10A to the back surface 10B. However, the order of arrangement of the light-transmitting base material, the resin layer, and the decorative layer is not specifically limited, provided that the hard coat layer is located closer to the front surface of the optical film than the light-transmitting base material, the resin layer, and the decorative layer. In FIG. 1, the front surface 10A of the optical film 10 corresponds to the surface 12A of the hard coat layer 12, and the front surface 10B of the optical film 10 corresponds to the surface of the decorative layer 14 and a part of the surface of the resin layer 13. Additionally, though the optical film 10 comprises the light-transmitting base material 11, an optical film may not comprise a light-transmitting base material, as described below.

The optical film 10 is foldable as described above. Specifically, no crack or break is preferably formed in the optical film 10 even if the below-described folding test (successive folding test) is repeated one hundred thousand times, two hundred thousand times, five hundred thousand times, or one million times on the optical film. In cases where the optical film 10 is, for example, cracked or broken when the successive folding test is repeated one hundred thousand times on the optical film 10, the foldability of the optical film 10 is evaluated as low. The evaluation is performed by the above successive folding test with at least 100 thousand folding events for the following reason. For example, assuming that an optical film is incorporated in a foldable smartphone, the frequency of folding (the frequency of opening and closing) is very high. Thus, an evaluation obtained by the above successive folding test with, for example, 10 thousand or 50 thousand folding events is unlikely to be practically meaningful. Specifically, assuming, for example, those who constantly use a smartphone, the smartphone is supposed to be opened and closed at a frequency of 5 to 10 times even during a morning commuting trip, and is supposed to be opened and closed at least 30 times even for one day. Thus, assuming that a smartphone is opened and closed 30 times for one day, a successive folding test with 10 thousand folding events is considered as a test assuming that the smartphone is used for one year because 30 times multiplied by 365 days equals 10950 times. It means that an optical film in the smartphone may be, for example, cracked or broken after using the smartphone for one year, even if the optical film shows a good evaluation result in the successive folding test with 10 thousand folding events. Accordingly, an evaluation obtained by the successive folding test with 10 thousand folding events is only sufficient for identification of optical films with a level for which the optical films are not usable as commercial products, and even optical films that can be used but are insufficient are evaluated as good in such a successive folding test and are not able to be properly evaluated. Thus, the evaluation should be performed by the above successive folding test with at least 100 thousand folding events, to assess whether or not an optical film is practically sufficient. The successive folding test may be carried out by folding the optical film 10 in such a manner that the front surface 10A of the optical film 10 faces inward, or by folding the optical film 10 in such a manner that the front surface 10A of the optical film 10 faces outward. In either case, no crack or break is preferably formed in the optical film.

Figure 2A:
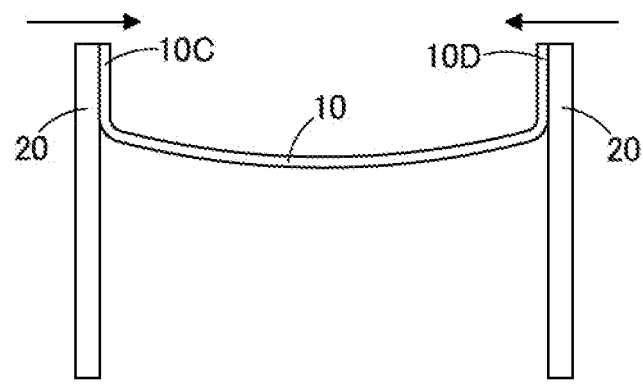
FIGS. 2(A) to 2(C) schematically illustrate the steps of the successive folding test.

The successive folding test is carried out as follows. The successive folding test starts with fixing the edge 10C and the edge 10D opposite to the edge 10C of a cut piece of the optical film 10 with a size of 30 mm×100 mm to fixing members 20 arranged in parallel to each other, as shown in FIG. 2(A). In cases where it is impossible to cut the optical film to a size of 30 mm×100 mm, for example, the optical film may be cut to a size of 20 mm×75 mm. In addition, the fixing members 20 can slide in the horizontal direction, as shown in FIG. 2(A).

Figure 2B:
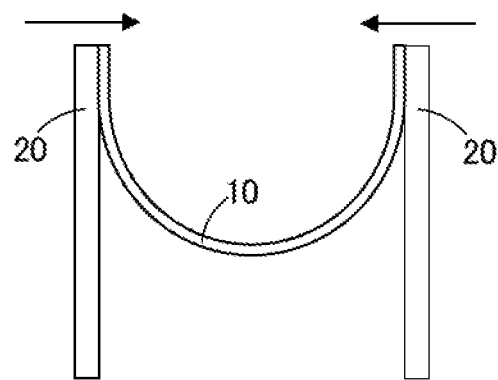
Figure 2C:
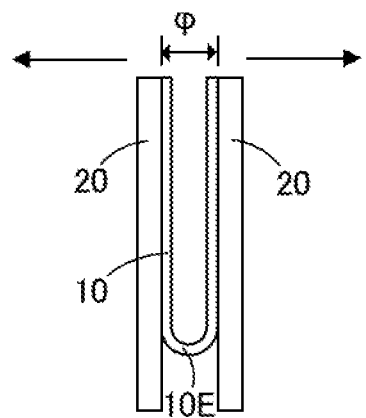

Next, the fixing members 20 are moved close to each other to fold and deform the optical film 10, as shown in FIG. 2(B), and the fixing members 20 are further moved until the gap distance φ between the two opposing edges 10C and 10D of the optical film 10 fixed to the fixing members 20 reaches 30 mm, as shown in FIG. 2(C), and the fixing members 20 are then moved in opposite directions to resolve the deformation of the optical film 10.

As shown in FIGS. 2(A) to (C), the fixing members 20 can be moved to fold the optical film 10. Additionally, a gap distance φ of 30 mm can be maintained between the two opposing edges 10C and 10D of the optical film 10 by carrying out the successive folding test in a manner that prevents the bent part 10E of the optical film 10 from being forced out beyond the lower edges of the fixing members 20 and controls the fixing members 20 to keep a gap distance of 30 mm when they approach each other closest. In this case, the outer width of the bent part 10E is considered as 30 mm. The thickness of the optical film 10 is small enough as compared with the gap distance (30 mm) between the fixing members 20. Thus, it seems unlikely that a difference in the thickness of the optical film 10 affects the result of the successive folding test on the optical film 10. More preferably, in the optical film 10, no crack or break is formed (a smaller gap distance φ between the two opposing edges 10C and 10D is more preferable) even when the successive folding test is repeated one hundred thousand times on the optical film 10 in a manner that leaves a gap distance of 20 mm, 10 mm, 6 mm, or 3 mm between the two opposing edges 10C and 10D.

The front surface 10A of the optical film 10 (the surface 12A of the hard coat layer 12) preferably has a hardness (pencil hardness) of B or harder, more preferably H or harder, when measured in the environment with a temperature of 23±5° C. and a relative humidity of 30% or more and 70% or less by the pencil hardness test specified by JIS K5600-5-4: 1999. The pencil hardness test should be carried out as follows: a piece of the optical film 10 is cut to a size of 30 mm×100 mm and fixed with Cello-tape®, manufactured by Nichiban Co., Ltd., over a glass plate without generation of any fold or wrinkle; and a pencil (product name: "uni"; manufactured by Mitsubishi Pencil Co., Ltd.) is moved using a pencil hardness tester (product name: "Pencil Scratch Hardness Tester (electric type)"; manufactured by Toyo Seiki Seisaku-sho, Ltd.) at a speed of 1 mm/sec on the surface of the optical film while a load of 750 g is applied to the pencil. The grade of the hardest pencil that does not scratch the surface of the optical film during the pencil hardness test is determined as the pencil hardness of the optical film. A plural number of pencils with different hardness are used for the measurement of pencil hardness and the pencil hardness test is repeated five times on each pencil. In cases where no scratch is made on the surface of the optical film with a pencil with specific hardness in four or more out of the five replicates, the pencil with the hardness is judged as making no scratch on the surface of the optical film. The above-described scratch refers to a scratch which is visibly detectable when the surface of the optical film subjected to the pencil hardness test is observed under transmitting fluorescent light.

The optical film 10 preferably has a yellow index (YI) of 15 or less. The optical film 10 with a YI of 15 or less can be less yellow in color and be applied to uses that require transparency of optical films. The maximum yellow index (YI) of the optical film 10 is more preferably 10 or less, 5 or less, or 1.5 or less. The yellow index (YI) is a value determined by setting a cut piece of the optical film with a size of 50 mm×100 mm in a spectrophotometer (product name: "UV-2450"; manufactured by Shimadzu Corporation; light source: tungsten lamp and deuterium lamp) in such a manner that the back surface faces the light source, measuring the transmittance in the wavelength range of 300 nm to 780 nm of the optical film in the environment with a temperature of 23±5° C. and a relative humidity of 30% or more and 70% or less, processing the obtained values according to the formula described in JIS Z8722: 2009 to calculate color tristimulus values X, Y, and Z, and processing the obtained tristimulus values X, Y, and Z according to a formula described in ASTM D1925: 1962. The maximum yellow index (YI) of the optical film 10 is more preferably 10 or less. The above yellow index (YI) is defined as the arithmetic mean of three measurements obtained by measuring a cut piece of the optical film three times. In the UV-2450, a yellow index is calculated on the monitor connected to the UV-2450 by reading the measurement data of the above transmittance and selecting the item "YI" from calculation items. The measurement of transmittance in the wavelength range of 300 nm to 780 nm is performed under the following conditions, and the transmittance should be determined by measuring transmittance at least five points spaced 1 nm apart in the wavelength range of 300 nm to 780 nm and calculating the average of the transmittance values. Additionally, in cases where fluctuation is observed in spectral transmittance spectra, smoothing treatment may be performed with a delta of 5.0 nm.

(Measurement Conditions)
  Wavelength range: 300-780 nm
  Scan speed: High
  Slit width: 2.0
  Sampling interval: Auto (0.5-nm intervals)
  Illumination: C
  Light source: D2 and WI
  Field: 2°
  Light source-switching wavelength: 360 nm
  S/R switching: Standard
  Detector: PM
  Autozero: performed at 550 nm subsequent to the baseline scan To adjust the yellow index (YI) of the optical film 10, the light-transmitting base material 11 may contain, for example, a coloring substance of blue color, the complementary color to yellow. Even if use of a polyimide base material as the light-transmitting base material results in a yellow color problem, the yellow index (YI) of the resulting optical film can be reduced by adding a coloring substance of blue color to the light-transmitting base material 11.

The optical film 10 preferably has a haze value (total haze value) of 3.0% or less. In cases where the above-described haze value of the optical film 10 is 3.0% or less and the optical film 10 is used in a mobile terminal, the image display screen of the mobile terminal can be inhibited from turning white in color. The above-described haze value is more preferably 2.0% or less, still more preferably 1.0% or less.

The above haze value can be measured using a haze meter (product name: "HM-150"; manufactured by Murakami Color Research Laboratory Co., Ltd.) in the environment with a temperature of 23±5° C. and a relative humidity of 30% or more and 70% or less by a method in accordance with JIS K7136: 2000. The above haze value is defined as the arithmetic mean of three measurements obtained by setting a cut piece of the optical film with a size of 50 mm×100 mm without generation of any curl or wrinkle and without any dirt such as fingerprints or grim, and measuring the cut piece of the optical film three times. The phrase "measuring three times" as used herein will refer not to measuring at the same position three times but to measuring at three different positions. In the optical film 10, not only the surface 10A but also a laminated layer such as the hard coat layer 12 is visually observed to be flat and also has a deviation in film thickness within ±10%. Accordingly, it is considered that an approximate average haze value of the whole optical film can be obtained by measuring the haze value at three different positions on the piece cut out from the optical film. The deviation in haze value is within ±10% even if a measurement object has a size as large as 1 m×3,000 m or has the same size as a 5-inch smartphone. If a piece having the same size as described above cannot be cut out from the optical film, a piece having a size equal to or greater than a diameter of 21 mm is required because, for example, the HM-150 haze meter has an entrance port aperture having a diameter of 20 mm for use in the measurement. Thus, a piece having a size of 22 mm×22 mm or larger may be cut out from the optical film as appropriate. If the piece of the optical film is small in size, the optical film is gradually shifted or turned in such an extent that the light source spot is within the piece of the optical film to secure three measurement positions.

The optical film 10 preferably has a total light transmittance of 85% or more. The optical film 10 with a total light transmittance of 85% or more can obtain an excellent light-transmitting property. The optical film 10 more preferably has a total light transmittance of 88% or more, further preferably 90% or more.

The above total light transmittance can be measured using a haze meter (product name: "HM-150"; manufactured by Murakami Color Research Laboratory Co., Ltd.) in the environment with a temperature of 23±5° C. and a relative humidity of 30% or more and 70% or less by a method in accordance with JIS K7361-1: 1997. Specifically, the total light transmittance is measured in the same manner as the measurement of haze value.

Additionally, in cases where an additional film, such as a polarizing plate, is provided on the back surface of the optical film through an adhesive or adhesion layer, the successive folding test, the yellow index measurement, the haze value measurement, and the total light transmittance measurement should be carried out after removing the additional film and the adhesive or adhesion layer. The additional film can be removed, for example, as follows. First of all, a laminate consisting of the optical film attached to the additional film through the adhesive or adhesion layer is heated with a hair dryer and is slowly separated by inserting a cutter blade into a possible interface between the optical film and the additional film. By repeating such a process of heating and separation, the adhesive or adhesion layer and the additional film can be removed. Even if such a removal process is performed, the test and measurements are not significantly affected. The haze value measurement should be carried out after removing the adhesive or adhesion layer and further wiping out any residue of the adhesive or adhesion layer with alcohol.

Examples of applications of the optical film 10 include, but are not specifically limited to, image display devices in smartphones, tablet terminals, personal computers (PCs), wearable terminals, digital signage systems, televisions, automotive navigation systems, and the like. Additionally, the optical film 10 is also suitable for vehicle displays. The form of each above-described image display device is also favorable for applications which require flexible forms, such as foldable or rollable forms.

The optical film 10 can be cut to a desired size or may be rolled. In cases where the optical film 10 is cut to a desired size, the cut piece of the optical film is not limited to a particular size, and the size of the film is appropriately determined depending on the display size of an image display device. Specifically, the optical film 10 may be, for example, 2.8 inches or more and 500 inches or less in size. The term "inch" as used herein will refer to the length of a diagonal when the optical film is rectangular, and to the length of a diameter when the optical film is circular, and to the average of major and minor axes when the optical film is elliptical. In cases where the optical film is rectangular here, the aspect ratio of the optical film is not specifically limited, which refers to the above-described size in inch determined for the optical film, provided that no problem is found in the optical film used for the display screen of an image display device. Examples of the aspect ratio include height-to-width ratios of 1:1, 4:3, 16:10, 16:9, and 2:1. However, particularly in optical films used for vehicle displays and digital signage systems which are rich in designs, the aspect ratio is not limited to the above-described aspect ratios. Additionally, in cases where the optical film 10 is large in size, the optical film will be trimmed to the A5 size (148 mm×210 mm) starting at an arbitrary position and then trimmed to fit size requirements of each measurement item. For example, if the optical film 10 is in a roll form, the optical film 10 of predetermined length should be pulled from a roll to cut a piece of the optical film with a desired size not from an invalid region including both edges along the longitudinal direction of the roll, but from a valid region near the center of the optical film, where the quality is constant.

In an image display device, the optical film 10 may be installed inside the image display device, and is preferably installed near the surface of the image display device. The optical film 10 installed near the surface of an image display device would serve as a cover film, which is used instead of a glass cover.

<<Light-Transmitting Base Material>>

The light-transmitting base material 11 is a base material having a light-transmitting property. The light-transmitting base material 11 preferably has a thickness of 10 μm or more and 100 μm or less. In cases where the light-transmitting base material 11 has a thickness of 10 μm or more, the resulting optical film can be prevented from curling and also have sufficient hardness. Furthermore, with such a light-transmitting base material, even an optical film produced by roll-to-roll process is less prone to wrinkling and less likely to deteriorate in appearance. In contrast, in cases where the light-transmitting base material 11 has a thickness of 100 μm or less, the resulting optical film 10 has excellent foldability, is able to satisfy the requirements of the successive folding test, and is also desirable in view of reducing the weight of the optical film 10. The thickness of the light-transmitting base material 11 is defined as the arithmetic mean of film thickness values measured at 10 different locations, where a cross-section of the light-transmitting base material 11 is imaged using a scanning electron microscope (SEM) and the film thickness of the light-transmitting base material 11 is measured at the 10 locations in the image of the cross-section. The lower limit of the light-transmitting base material 11 is more preferably 20 μm or more, 30 μm or more, or 40 μm or more, while the upper limit of the light-transmitting base material 11 is more preferably 80 μm or less, 70 μm or less, or 60 μm or less.

The constituent material for the light-transmitting base material 11 include resins such as polyimide resins, polyamide-imide resins, polyamide resins, polyester resins (for example, polyethylene terephthalate resins and polyethylene naphthalate resins), or mixtures of two or more of these resins. Among those resins, polyimide resins, polyamide resins, or mixtures thereof are preferred in terms of several aspects: the resulting optical film has excellent hardness and transparency as well as is less cracked or broken during the foldability test, also has outstanding heat resistance, and can obtain further excellent hardness and transparency by film baking.

A polyimide resin can be obtained from the reaction between a tetracarboxylic component and a diamine component. The polyimide resin is not specifically limited, and preferably has, for example, at least one structure selected from the group consisting of the structures represented by the general formula (1) below and the general formula (3) below, to provide an excellent light-transmitting property and excellent rigidity.

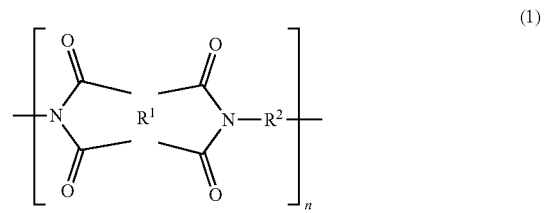

In the above-described general formula (1), $R^1$ represents a tetracarboxylic acid residue as a tetravalent group; $R^2$ represents at least one divalent group selected from the group consisting of trans-cyclohexanediamine residue, trans-1,4-bismethylene cyclohexanediamine residue, 4,4'-diaminodiphenyl sulfone residue, 3,4'-diaminodiphenyl sulfone residue, and divalent groups represented by the general formula (2) below; and n represents the number of repeating units, which is 1 or more. In this specification, the "tetracarboxylic acid residue" refers to a residue remaining after subtracting four carboxylic groups from a tetracarboxylic acid, and represents the same structure as a residue remaining after subtracting the acid dianhydride structure from a tetracarboxylic dianhydride. Additionally, the "diamine residue" refers to a residue remaining after subtracting two amino groups from a diamine.

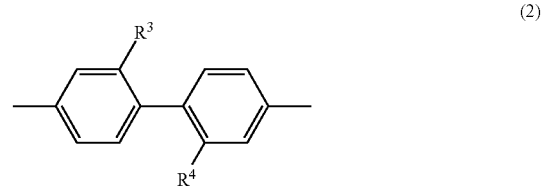

In the above-described general formula (2), $R^3$ and $R^4$ each independently represent a hydrogen atom, alkyl group, or perfluoroalkyl group.

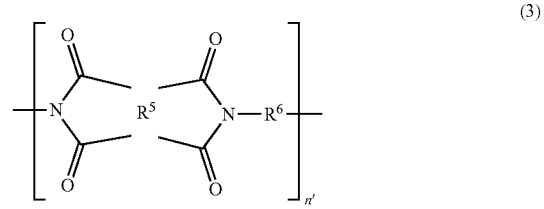

In the above-described general formula (3), $R^5$ represents at least one tetravalent group selected from the group consisting of cyclohexane tetracarboxylic acid residue, cyclopentane tetracarboxylic acid residue, dicyclohexane-3,4,3',4'-tetracarboxylic acid residue, and 4,4'-(hexafluoroisopropylidene)diphthalic acid residue; $R^6$ represents a diamine residue as a divalent group; and n' represents the number of repeating units, which is 1 or more.

In the above-described general formula (1), $R^1$ refers to a tetracarboxylic acid residue and can represent, as indicated above, a residue remaining after subtracting the acid dianhydride structure from a tetracarboxylic dianhydride. As $R^1$ in the above-described general formula (1), preferably at least one selected from the group consisting of 4,4'-(hexafluoroisopropylidene)diphthalic acid residue, 3,3',4,4'-biphenyl tetracarboxylic acid residue, pyromellitic residue, 2,3',3,4'-biphenyl tetracarboxylic acid residue, 3,3',4,4'-benzophenone tetracarboxylic acid residue, 3,3',4,4'-diphenylsulfone tetracarboxylic acid residue, 4,4'-oxydiphthalic acid residue, cyclohexane tetracarboxylic acid residue, and cyclopentane tetracarboxylic acid residue, more preferably at least one selected from the group consisting of 4,4'-(hexafluoroisopropylidene)diphthalic acid residue, 4,4'-oxydiphthalic acid residue, and 3,3',4,4'-diphenylsulfone tetracarboxylic acid residue, is contained, among others, in view of improving the light-transmitting property and the rigidity.

As $R^1$, those suitable residues are contained preferably at a total concentration of 50% by mole or more, further preferably 70% by mole or more, and still further preferably 90% by mole or more.

Additionally, at least one selected from a group of tetracarboxylic acid residues suitable for improving the rigidity (group A), such as the group consisting of 3,3',4,4'-biphenyl tetracarboxylic acid residue, 3,3',4,4'-benzophenone tetracarboxylic acid residue, and pyromellitic residue, and at least one selected from a group of tetracarboxylic acid residues suitable for improving the transparency (group B), such as the group consisting of 4,4'-(hexafluoroisopropylidene) diphthalic acid residue, 2,3',3,4'-biphenyl tetracarboxylic acid residue, 3,3',4,4'-diphenylsulfone tetracarboxylic acid residue, 4,4'-oxydiphthalic acid residue, cyclohexane tetracarboxylic acid residue, and cyclopentane tetracarboxylic acid residue, are preferably used in combination as $R^1$.

For the content ratio of the group of tetracarboxylic acid residues suitable for improving the rigidity (group A) to the group of tetracarboxylic acid residues suitable for improving the transparency (group B) in that case, preferably 0.05 moles or more and 9 moles or less, further preferably 0.1 moles or more and 5 moles or less, still further preferably 0.3 moles or more and 4 moles or less, of the group of tetracarboxylic acid residues suitable for improving the rigidity (group A) are combined with 1 mole of the group of tetracarboxylic acid residues suitable for improving the transparency (group B).

In the above-described general formula (1), $R^2$ preferably represents at least one divalent group selected from the group consisting of 4,4'-diaminodiphenyl sulfone residue, 3,4'-diaminodiphenyl sulfone residue, and divalent groups represented by the above-described general formula (2), further preferably at least one divalent group selected from the group consisting of 4,4'-diaminodiphenyl sulfone residue, 3,4'-diaminodiphenyl sulfone residue, and divalent groups represented by the above-described general formula (2) where $R^3$ and $R^4$ each represent a perfluoroalkyl group, among others, in view of improving the light transmittance and the rigidity.

As $R^5$ in the above the general formula (3), 4,4'-(hexafluoroisopropylidene)diphthalic acid residue, 3,3',4,4'-diphenylsulfone tetracarboxylic acid residue, and oxydiphthalic acid residue are preferably contained, among others, in view of improving the light-transmitting property and the rigidity.

As $R^5$, those suitable residues are contained preferably at a concentration of 50% by mole or more, further preferably 70% by mole or more, and still further preferably 90% by mole or more.

In the above-described general formula (3), $R^6$ refers to a diamine residue and can represent, as indicated above, a residue remaining after subtracting two amino groups from a diamine. As $R^6$ in the above-described general formula (3), preferably at least one divalent group selected from the group consisting of 2,2'-bis(trifluoromethyl)benzidine residue, bis[4-(4-aminophenoxy)phenyl]sulfone residue, 4,4'-diaminodiphenyl sulfone residue, 2,2-bis[4-(4-aminophenoxy)phenyl]hexafluoropropane residue, bis[4-(3-aminophenoxy)phenyl]sulfone residue, 4,4'-diamino-2,2'-bis(trifluoromethyl)diphenyl ether residue, 1,4-bis[4-amino-2-(trifluoromethyl)phenoxy]benzene residue, 2,2-bis[4-(4-amino-2-trifluoromethylphenoxy)phenyl]hexafluoropropane residue, 4,4'-diamino-2-(trifluoromethyl)diphenyl ether residue, 4,4'-diaminobenzanilide residue, N,N'-bis(4-aminophenyl)terephthalamide residue, and 9,9-bis(4-aminophenyl)fluorene residue, further preferably at least one divalent group selected from the group consisting of 2,2'-bis(trifluoromethyl)benzidine residue, bis[4-(4-aminophenoxy)phenyl]sulfone residue, and 4,4'-diaminodiphenyl sulfone residue, is contained, among others, in view of improving the light transmittance and the rigidity.

As $R^6$, those suitable residues are contained preferably at a total concentration of 50% by mole or more, further preferably 70% by mole or more, and still further preferably 90% by mole or more.

Additionally, a combination of at least one selected from a group of diamine residues suitable for improving the rigidity (group C), such as the group consisting of bis[4-(4-aminophenoxy)phenyl]sulfone residue, 4,4'-diaminobenzanilide residue, N,N'-bis(4-aminophenyl)terephthalamide residue, para-phenylenediamine residue, meta-phenylenediamine residue, and 4,4'-diaminodiphenylmethane residue, and at least one selected from a group of diamine residues suitable for improving the transparency (group D), such as the group consisting of 2,2'-bis(trifluoromethyl)benzidine residue, 4,4'-diaminodiphenyl sulfone residue, 2,2-bis[4-(4-aminophenoxy)phenyl]hexafluoropropane residue, bis[4-(3-aminophenoxy)phenyl]sulfone residue, 4,4'-diamino-2,2'-bis(trifluoromethyl)diphenyl ether residue, 1,4-bis[4-amino-2-(trifluoromethyl)phenoxy]benzene residue, 2,2-bis[4-(4-amino-2-trifluoromethylphenoxy)phenyl]hexafluoropropane residue, 4,4'-diamino-2-(trifluoromethyl)diphenyl ether residue, and 9,9-bis(4-aminophenyl)fluorene residue, is preferably used as $R^6$.

For the content ratio of the group of diamine residues suitable for improving the rigidity (group C) to the group of diamine residues suitable for improving the transparency (group D) in that case, preferably 0.05 moles or more and 9 moles or less, further preferably 0.1 moles or more and 5 moles or less, more preferably 0.3 moles or more and 4 moles or less, of the group of diamine residues suitable for improving the rigidity (group C) are combined with 1 mole of the group of diamine residues suitable for improving the transparency (group D).

For the structures represented by the above-described general formulae (1) and (3), n and n' each independently represent the number of repeating units, which is 1 or more. The number of repeating units, n, in the polyimide may be appropriately selected depending on the structure to allow the polyimide to have a preferred glass transition temperature as described below, and is not limited to a particular number. The average number of repeating units is typically 10 to 2,000, further preferably 15 to 1,000.

Additionally, the polyimide resin may partially contain a polyamide structure. Examples of the polyamide structure that may be contained include a polyamide-imide structure containing a tricarboxylic acid residue such as trimellitic anhydride, and a polyamide structure containing a dicarboxylic acid residue such as terephthalic acid.

The polyimide resin preferably has a glass transition temperature of 250° C. or higher, further preferably 270° C. or higher, in terms of heat resistance, while the polyimide resin preferably has a glass transition temperature of 400° C. or lower, further preferably 380° C. or lower, in terms of ease of stretching and of reducing the baking temperature.

Specific examples of the polyimide resin include compounds having the structure represented by the formula below. In the formulae below, n represents the number of repeating units, which is an integer of 2 or more.

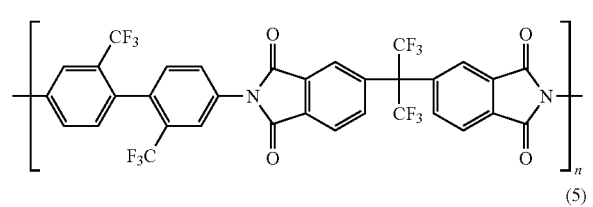
(4)

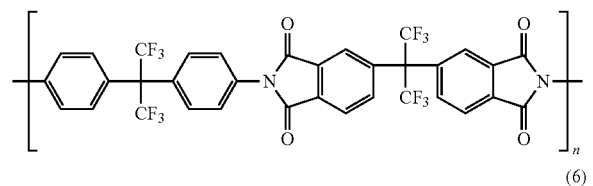
(5)

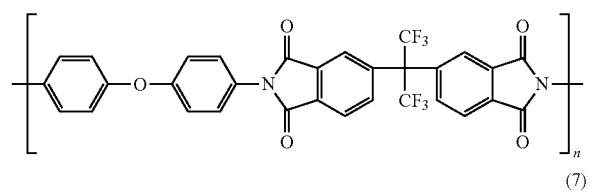
(6)

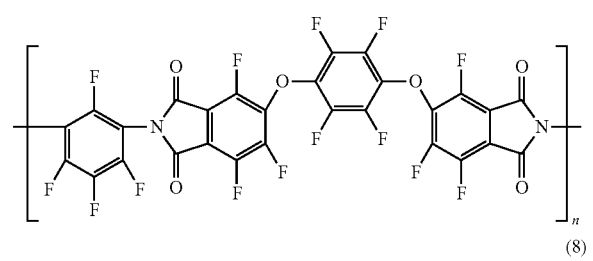
(7)

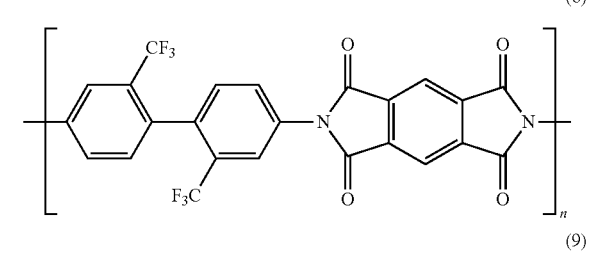
(8)

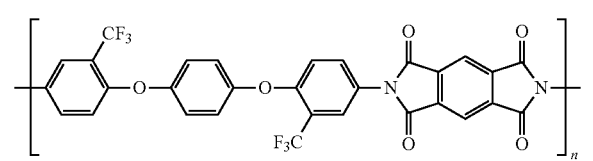
(9)

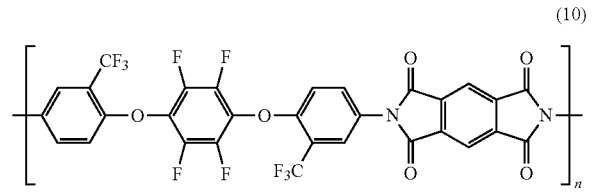
(10)

-continued

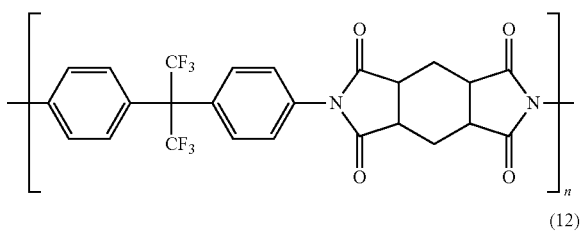
(11)

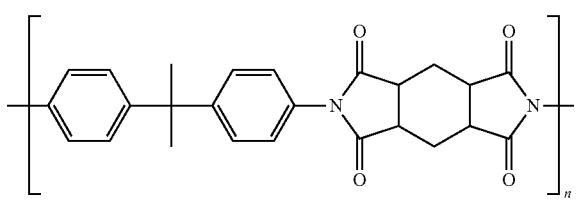
(12)

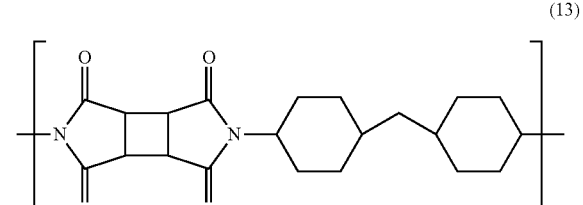
(13)

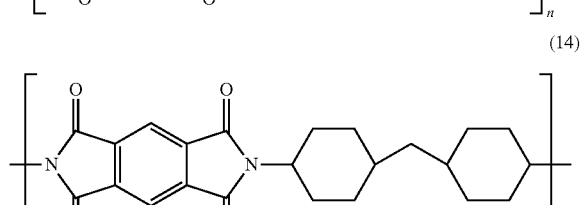
(14)

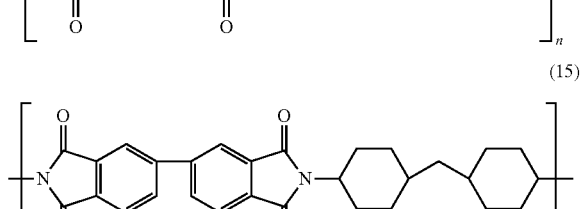
(15)

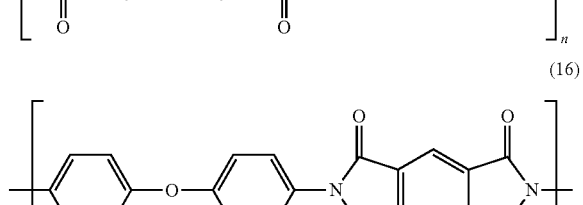
(16)

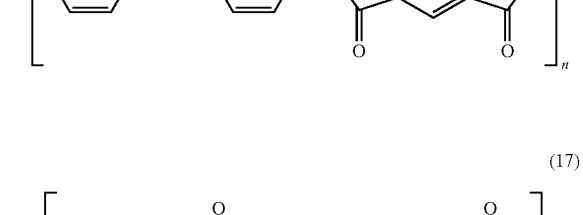
(17)

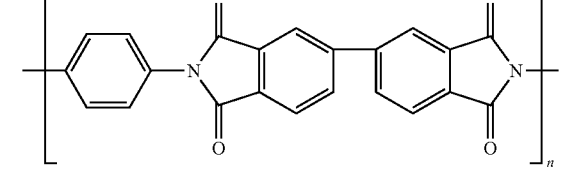

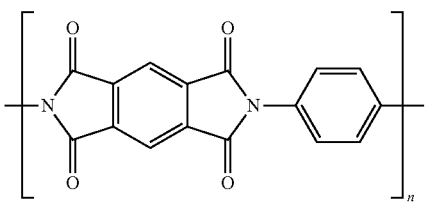

(18)

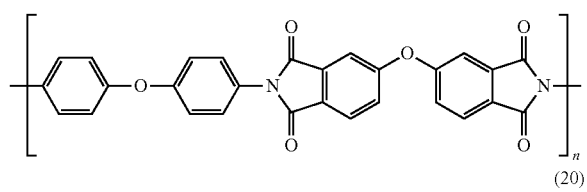

(19)

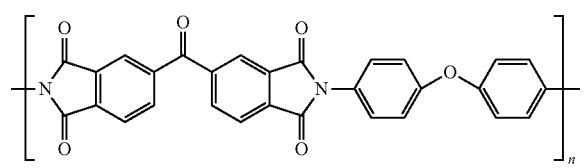

(20)

Among the above-described polyimide resins, the polyimide or polyamide resins having structures that inhibit intramolecular or intermolecular charge transfer are preferred because of the excellent transparency, specifically including the fluorinated polyimide resins represented by, for example, the above-described formulae (4) to (11) and the polyimide resins containing alicyclic structures represented by, for example, the above-described formulae (13) to (15).

Additionally, the fluorinated polyimide resins represented by, for example, the above-described formulae (4) to (11) contain a fluorinated structure and thus have high heat resistance, and are not colored by the heat generated during polyimide film production, which causes the resulting film to have excellent transparency.

The concept of polyamide resin includes aromatic polyamides (aramids) as well as aliphatic polyamides. Examples of the polyamide resin include compounds having any of the structures represented by the formulae (21) to (23) below. In the formulae below, n represents the number of repeating units, which is an integer of 2 or more.

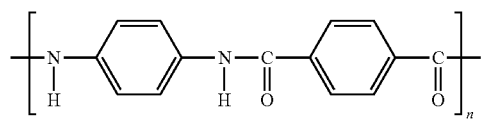

(21)

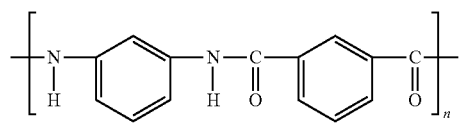

(22)

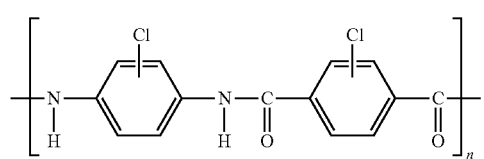

(23)

A commercially available base material may be used as a base material containing the polyimide or polyamide resin represented by any of the above-described formulae (4) to (20) and (23). Examples of a commercially available base material containing the above-described polyimide resin include Neopulim® manufactured by Mitsubishi Gas Chemical Company, Inc., and the like, while examples of a commercially available base material containing the above-described polyamide resin include Mictron® manufactured by Toray Industries, Inc., and the like.

Additionally, polyimide or polyamide resins synthesized by any known methods may be used as the polyimide or polyamide resins represented by the above-described formulae (4) to (20) and (23). For example, the polyimide resin represented by the above-described formula (4) is synthesized by a method described JP2009-132091A and can be obtained, specifically, by a reaction of 4,4'-hexafluoropropylidenebisphthalic dianhydride (FPA) and 2,2'-bis(trifluoromethyl)-4,4'-diaminobiphenyl (TFDB), as represented by the formula (24) below.

(24)

6FPA

TFBD

The weight average molecular weight of the above-described polyimide or polyamide resin preferably ranges from 3,000 to 500,000, more preferably from 5,000 to 300,000, further preferably from 10,000 to 200,000, inclusive. The resin with a weight average molecular weight of less than 3,000 may not have enough strength, while the resin with a weight average molecular weight of more than 500,000 has an increased viscosity and a reduced solubility, which in turn may result in failure to provide a base material with smooth surface and homogeneous film thickness. In this specification, the "weight average molecular weight" is measured by gel permeation chromatography (GPC) as a value in terms of polystyrene.

As the light-transmitting base material 11, a base material containing any of the fluorinated polyimide resins represented by, for example, the above-described formulae (4) to (11) or containing the halogenated polyamide resin represented by, for example, the above-described formula (23) is preferably used in view of the ability to improve the hardness. Among those, a base material containing the polyimide resin represented by the above-described formula (4) is more preferably used in view of the ability to further improve the hardness.

Examples of the polyester resin include resins containing at least one component selected from the group consisting of polyethylene terephthalate, polypropylene terephthalate, polybutylene terephthalate, and polyethylene naphthalate.

<<Hard Coat Layer>>

The hard coat layer 12 is provided on the first surface 11A of the light-transmitting base material 11. The term "hard coat layer" as used herein will refer to a layer with a light-transmitting property and a Martens hardness of 375 MPa or more. In this specification, the term "Martens hardness" refers to a hardness measured when an indenter is pressed into a specimen to a depth of 500 nm in a nanoindentation hardness test. Measurement of the Martens hardness based on the above-described nanoindentation technique will be performed on a measurement sample using a "T1950 TriboIndenter" manufactured by Hysitron, Inc. Specifically, a piece of an optical film with a size of 1 mm×10 mm is cut from the optical film and embedded in an embedding resin to prepare a block, and homogeneous sections having a thickness of 70 nm or more and 100 nm or less and having no openings or the like are sliced from the block according to a commonly used sectioning technique. For the preparation of sections, for example, an "Ultramicrotome EM UC7" from Leica Microsystems GmbH or the like can be used. Then, the block remaining after slicing the sections is used as a measurement sample. Subsequently, a Berkovich indenter (a trigonal pyramid, TI-0039, manufactured by BRUKER Corporation) as the above-described indenter is pressed into the cross-section of the hard coat layer to a depth of 500 nm at the center in the cross-section of the measurement sample obtained after cutting out the sections, under the below-mentioned measurement conditions. In this respect, a Berkovich indenter should be pressed into the hard coat layer at a position located 500 nm away from the interface between the light-transmitting base material and the hard coat layer toward the center of the hard coat layer and 500 nm away from both edges of the hard coat layer toward the center of the hard coat layer, in order to avoid the influence of the side edges of the light-transmitting base material and the hard coat layer. Subsequently, the intender is held at the position for a certain period of time to relax the residual stress, and then unloaded to measure the maximum load after the relaxation, and the maximum load $P_{max}$ (μN) and the area A (nm$^2$) of a depression with a depth of 500 nm are used to calculate a Martens hardness from the value of $P_{max}/A$. The Martens hardness is defined as the arithmetic mean of measured values at 10 different locations. In cases where a measured value which falls outside the arithmetic mean plus and minus 20% is included in the measured values, the measured value should be excluded to repeat the measurement again. Whether or not a measured value which falls outside the arithmetic mean plus and minus 20% is included in the measured values should be determined by whether or not a value (%) obtained by the formula (A−B)/B×100 equals or exceeds ±20%, where A represents a measured value and B represents the arithmetic mean.

(Measurement Conditions)
 Loading speed: 10 nm/sec
 Dwell time: 5 sec
 Unloading speed: 10 nm/sec
 Assay temperature: 23-28° C.
 Relative humidity: 30-70%

The hard coat layer 12 preferably has a Martens hardness of 375 MPa or more and 2,000 MPa or less. The hard coat layer 12 with a Martens hardness of 375 MPa or more can have sufficient hardness, while the hard coat layer 12 with a Martens hardness of 2,000 MPa or less can prevent breakage of the hard coat layer 12 when folded. When the hard coat layer has a multilayer structure, the Martens hardness of the hard coat layer is defined as the average of the Martens hardness values of layers that constitute the hard coat layer. The minimum Martens hardness values are listed in the order of preference for the hard coat layer 12: 600 MPa or more, and 800 MPa or more, while the maximum Martens hardness values are listed in the order of preference for the hard coat layer 12: 1,500 MPa or less, 1,300 MPa or less, and 1,000 MPa or less.

The hard coat layer 12 preferably has a film thickness of 1 μm or more and 20 μm or less. The hard coat layer 12 with a film thickness of 1 μm or more can have sufficient hardness, while the hard coat layer with a film thickness of 20 μm or less can prevent reduction in workability. The "film thickness of the hard coat layer" as used herein will refer to the sum of the film thickness (total thickness) of hard coat layers in cases where the hard coat layer has a multilayer structure. The upper limit of the hard coat layer 12 is more preferably 15 μm or less, further preferably 10 μm or less.

The film thickness of the hard coat layer 12 is defined as the arithmetic mean of film thickness values measured at 20 different locations, where a cross-section of the hard coat layer 12 is imaged using a scanning transmission electron microscope (STEM) or a transmission electron microscope (TEM), and the film thickness of the hard coat layer 12 is measured at the 20 locations within the image of the cross-section. A specific method of acquiring cross-sectional images is described below. First of all, a piece of 1 mm×10 mm cut from the optical film is embedded in an embedding resin to prepare a block, and homogeneous sections having a thickness of 70 nm or more and 100 nm or less and having no openings or the like are sliced from the block according to a commonly used sectioning technique. For the preparation of sections, for example, an "Ultramicrotome EM UC7" from Leica Microsystems GmbH or the like can be used. Then, these homogeneous sections having no openings or the like are used as measurement samples. Subsequently, cross-sectional images of the measurement sample are acquired using a scanning transmission electron microscope (STEM) (product name: "S-4800"; manufactured by Hitachi High-Technologies Corporation). The cross-sectional images are acquired using the above-described S-4800 by setting the detector to "TE," the accelerating voltage to "30 kV," and the emission current to "10 μA." The focus, contrast, and brightness are appropriately adjusted at a magnification of 5,000 to 200,000 times, so that each layer can be identified by observation. The magnification is preferably 10,000 times to 100,000 times, more preferably 10,000 times to 50,000 times, most preferably 25,000 times to 50,000 times. Furthermore, the beam monitor aperture, the objective lens aperture, and the WD may be respectively set to "3," "3," and "8 mm," in acquirement of cross-sectional images using the above-described S-4800. For the measurement of the film thickness of the hard coat layer, it is important that the contrast at the interfacial boundary between the hard coat layer and another layer (for example, the light-transmitting base material) can be observed as clearly as possible when the cross-section is observed. In cases where the interfacial boundary is hardly observed due to lack of contrast, a staining process may be applied because interfacial boundaries between organic layers become easily observed by application of a staining procedure with osmium tetraoxide, ruthenium tetraoxide, phosphotungstic acid, or the like. Additionally, higher magnification may make it more difficult to find the interfacial contrast. In that case, the observation is also carried out with low magnification. For example, the observation is carried out with two magnifications consisting of a higher magnification, such as 25,000 or 50,000 times, and a lower magnification, such as 50,000 or 100,000 times, to determine the above arithmetic means at both magnifications, which are further averaged to determine the film thickness of the hard coat layer.

The hard coat layer may have a monolayer structure, but preferably has a multilayer structure composed of two or more hard coat layers in view of improving the foldability. The hard coat layer 12 illustrated in FIG. 1 is composed of a first hard coat layer 15 and a second hard coat layer 16 overlaid on the first hard coat layer 15.

<First Hard Coat Layer>

The first hard coat layer 15 is a layer mainly for providing hardness to the optical film 10. The first hard coat layer 15 preferably has a Martens hardness of 500 MPa or more and 2,000 MPa or less. The first hard coat layer 15 exhibiting a Martens hardness of 500 MPa or more and 2,000 MPa or less at half the height of the cross-section allows the hard coat layer 12 not to have insufficient hardness but to have better foldability. Preferably, the first hard coat layer 15 has a minimum Martens hardness of 600 MPa or more and a maximum Martens hardness of 1,500 MPa or more.

The Martens hardness of the first hard coat layer 15 is preferably larger than the Martens hardness of the second hard coat layer 16. Such a relationship in Martens hardness causes the optical film 10 to have a particularly good pencil hardness. This is because deformation is suppressed and a less severe form of scratch or depression is formed in the optical film 10 when a load is applied to press the point of a pencil down onto the optical film 10 in the pencil hardness test. Examples of a method of increasing the Martens hardness of the first hard coat layer 15 above the Martens hardness of the second hard coat layer 16 include a method in which the amount of the below-described inorganic particles contained in the first hard coat layer 15 is adjusted to be larger than that in the other hard coat layer. Additionally, in cases where the hard coat layer has a monolayer structure, it is preferred that inorganic particles are unevenly distributed in the hard coat layer toward the base material film; that is, the abundance of the inorganic particles in the above-described hard coat layer is preferably increased toward the light-transmitting base material and decreased toward the surface of the optical film.

The first hard coat layer 15 contains a resin. Preferably, the first hard coat layer 15 further contains inorganic particles dispersed in the resin.

(Resin)

The resin comprises a polymerized product (a cured product) of a polymerizable compound (a curable compound). The polymerizable compound refers to a molecule having at least one polymerizable functional group. Examples of the polymerizable functional group include ethylenic unsaturated groups such as (meth)acryloyl group, vinyl group, and allyl group. Both "acryloyl group" and "methacryloyl group" are meant by the word "(meth)acryloyl group."

The polymerizable compound is preferably a polyfunctional (meth)acrylate. Examples of the above-described polyfunctional (meth)acrylate include trimethylolpropane tri(meth)acrylate, tripropylene glycol di(meth)acrylate, diethylene glycol di(meth)acrylate, dipropylene glycol di(meth)acrylate, pentaerythritol tri(meth)acrylate, pentaerythritol tetra(meth)acrylate, dipentaerythritol hexa(meth)acrylate, 1,6-hexanediol di(meth)acrylate, neopentyl glycol di(meth)acrylate, trimethylolpropane tri(meth)acrylate, ditrimethylolpropane tetra(meth)acrylate, dipentaerythritol penta(meth)acrylate, tripentaerythritol octa(meth)acrylate, tetrapentaerythritol deca(meth)acrylate, isocyanuric acid tri(meth)acrylate, isocyanuric acid di(meth)acrylate, polyester tri(meth)acrylate, polyester di(meth)acrylate, bisphenol di(meth)acrylate, diglycerol tetra(meth)acrylate, adamantyl di(meth)acrylate, isobornyl di(meth)acrylate, dicyclopentane di(meth)acrylate, tricyclodecane di(meth)acrylate, ditrimethylolpropane tetra(meth)acrylate, and those compounds modified with PO, EO, caprolactone, or the like.

Among those polyfunctional polymerizable compounds, polymerizable compounds with three to six functional groups trifunctional, such as pentaerythritol triacrylate (PETA), dipentaerythritol hexaacrylate (DPHA), pentaerythritol tetraacrylate (PETTA), dipentaerythritol pentaacrylate (DPPA), trimethylolpropane tri(meth)acrylate, tripentaerythritol octa(meth)acrylate, and tetrapentaerythritol deca(meth)acrylate, are preferred in terms of the ability to achieve the above-described Martens hardness in a suitable manner. In this specification, the word "(meth)acrylate" means acrylate and methacrylate.

A monofunctional (meth)acrylate monomer may be further contained for the purpose of, for example, adjusting the hardness of the resin and the viscosity of the composition, and improving the adhesiveness of the resin. Examples of the above-described monofunctional (meth)acrylate monomer include hydroxyethyl acrylate (HEA), glycidyl methacrylate, methoxypolyethylene glycol (meth)acrylate, isostearyl (meth)acrylate, 2-acryloyloxyethyl succinate, acryloyl morpholine, N-acryloyloxyethyl hexahydrophthalimide, cyclohexyl acrylate, tetrahydrofuryl acrylate, isobornyl acrylate, phenoxyethyl acrylate, and adamantyl acrylate.

The above-described monomer preferably has a weight average molecular weight of less than 1,000, more preferably 200 or more and 800 or less, in view of improving the hardness of the resin layer. Additionally, the above-described polymerizable oligomer preferably has a weight average molecular weight of 1,000 or more and 20,000 or less, more preferably 1,000 or more and 10,000 or less, further preferably 2,000 or more and 7,000 or less.

(Inorganic Particles)

Silica particles are preferred as the inorganic particles in terms of the ability to achieve excellent hardness, though the inorganic particles are not limited to particular particles as long as those inorganic particles can improve the hardness of the hard coat layer. Among silica particles, reactive silica particles are preferred. The above-described reactive silica particle can form a cross-linked structure with the above-described polyfunctional (meth)acrylate and the presence of the reactive silica particles can sufficiently increase the hardness of the first hard coat layer 15.

The above-described reactive silica particles preferably carry any reactive functional group on the surface, and polymerizable functional groups, such as those described above, are suitably used as the reactive functional group.

The above-described reactive silica particles are not limited to particular reactive silica particles, and conventionally known reactive silica particles can be used, examples of which include reactive silica particles described in JP2008-165040A. Additionally, examples of commercially available reactive silica particles as describe above include MIBK-SD, MIBK-SDMS, MIBK-SDL, and MIBK-SDZL manufactured by Nissan Chemical Industries, Ltd.; and V8802 and V8803 manufactured by JGC C&C.

Additionally, the above-described silica particles may be spherical silica particles but are preferably deformed silica particles. Spherical silica particles may be combined with deformed silica particles. In this specification, the "spherical silica particle" refers to, for example, a spherical or ellipsoidal silica particle, while "deformed silica particle" refers to a silica particle with a randomly rough surface as observed on potato tubers (having an aspect ratio of 1.2 or more and 40 or less when a cross-section is observed). Because the above-described deformed silica particle has a larger surface area than that of a spherical silica particle, the presence of such deformed silica particles increases the contact area with, for example, the above-described polyfunctional (meth)acrylate and can thereby improve the hardness of the above-described hard coat layer. Observation of a cross-section of the hard coat layer under a transmission electron microscope (TEM) or scanning transmission electron microscope (STEM) can determine whether silica particles contained in the hard coat layer are deformed silica particles or not. In cases where spherical silica particles are used, a decrease in the particle diameter of the spherical silica particles would increase the hardness of the hard coat layer. In contrast, deformed silica particles can provide the hard coat layer with the same level of hardness as commercially available spherical silica particles with the smallest particle diameter, even though the deformed silica particles are not as small as the spherical silica particles.

The above-described silica particles preferably have an average particle diameter of 5 nm or more and 200 nm or less. In cases where silica particles have an average particle diameter of less than 5 nm, such a small particle diameter makes it difficult to produce particles with the small particle diameter, which may aggregate each other, and also makes it very difficult to produce deformed particles with the small particle diameter, which are, furthermore, less dispersible and may aggregate each other in the above-described ink composition before use for coating. On the other hand, in cases where the above-described deformed silica particles have an average particle diameter of more than 200 nm, problems such as formation of a very rough surface and increase of haze may occur in the hard coat layer. In cases where the silica particles are spherical silica particles, the average particle diameter of the silica particles is defined as the arithmetic mean of the particle diameters of 20 particles, where the particle diameters of the 20 particles are measured from cross-sectional images of particles acquired using a transmission electron microscope (TEM) or scanning transmission electron microscope (STEM). Additionally, in cases where the silica particles are deformed silica particles, the average particle diameter of the silica particles is defined as the arithmetic mean of the particle diameters of 20 particles, which are determined by measuring the maximum (major axis) and minimum (minor axis) values of the distance between two points on the circumference of each particle within a cross-sectional image of the hard coat layer acquired using a transmission electron microscope (TEM) or scanning transmission electron microscope (STEM), averaging the obtained values to determine the diameter of the particle, and repeating the measurement for the 20 particles. The cross-sectional images are acquired using a scanning transmission electron microscope (STEM) (for example, product name: "5-4800 (TYPE 2)"; manufactured by Hitachi High-Technologies Corporation) by setting the detector (signal selection) to "TE," the accelerating voltage to "30 kV," and the emission current to "10 µA."

The hardness (Martens hardness) of the first hard coat layer 15 can be controlled by adjusting the size and amount of the above inorganic particles. For example, in the formation of the first hard coat layer 15, 25 to 60 parts by mass of the above silica particles with an average particle diameter of 5 nm or more and 200 nm or less are preferably contained in 100 parts by mass of the above polymerizable compound.

<Second Hard Coat Layer>

The second hard coat layer 16 is a layer provided to satisfy the requirements of the above-described successive folding test. The second hard coat layer 16 preferably has a Martens hardness of 375 MPa or more and 1,500 MPa or less. The second hard coat layer 16 exhibiting a Martens hardness of 375 MPa or more and 1,500 MPa or less at half the height of the cross-section allows the hard coat layer 12 not to have insufficient abrasion resistance but to have better foldability. More preferably, the second hard coat layer 16 has a minimum Martens hardness of 450 MPa or more and a maximum Martens hardness of 575 MPa or more.

The second hard coat layer 16 contains a resin. The second hard coat layer 16 may further contain inorganic particles dispersed in the resin.

(Resin)

The resin comprises a polymerized product (a cured product) of a polymerizable compound (a curable compound). The polymerizable compound is preferably a polyfunctional (meth)acrylate. The above-described polyfunctional (meth)acrylate include the same polyfunctional (meth)acrylates as described for the first hard coat layer 15. Additionally, the second hard coat layer 16 may contain, for example, polyfunctional urethane (meth)acrylate and/or polyfunctional epoxy (meth)acrylate, in addition to the above-described polyfunctional (meth)acrylate.

(Inorganic Particles)

The inorganic particles include the same types of inorganic particles as described for the first hard coat layer 15. The content of the inorganic particles in the second hard coat layer 16 is not specifically limited, and is preferably, for example, 0% by mass or more and 50% by mass or less to the second hard coat layer 16.

At least either the first hard coat layer 15 or the second hard coat layer 16 may contain any materials other than the above-described materials as long as the above-described Martens hardness is achieved even if those additional materials are contained. For example, a polymerizable monomer, oligomer, or the like which forms a cured product upon exposure to ionizing radiation may be additionally contained as a resin component material. As the above-described polymerizable monomer or oligomer, (meth)acrylate monomers or oligomers each containing a radical polymerizable unsaturated group in the molecule are included. Examples of the above-described (meth)acrylate monomers or oligomers each containing a radical polymerizable unsaturated group in the molecule include monomers or oligomers of, for example, urethane (meth)acrylate, polyester (meth)acrylate, epoxy (meth)acrylate, melamine (meth)acrylate, polyfluoroalkyl (meth)acrylate, and silicone (meth)acrylate. These polymerizable monomers or oligomers may be used individually or in combination of two or more. Among those monomers or oligomers, a monomer or oligomer of polyfunctional (hexafunctional or higher) urethane (meth) acrylate with a weight average molecular weight of 1,000 to 10,000 is preferred.

The hard coat layer 12 (at least either the first hard coat layer 15 or the second hard coat layer 16) may further contain an ultraviolet absorber, a spectral transmittance modifier, and/or an antifouling agent.

<<Resin Layer>>

The resin layer 13 is a layer composed of a light-transmitting resin and providing impact absorption. The resin layer may have a multilayer structure composed of two or more resin layers.

The resin layer 13 preferably has a Martens hardness of 1 MPa or more and 100 MPa or less. The resin layer 13 with a Martens hardness of 1 MPa or more can further prevent formation of depression on the surface of the optical film and of damage to components located interior to the optical film in an image display device upon impact on the surface of the optical film. Additionally, the resin layer 13 with a Martens hardness of 100 MPa or less provides better foldability. When the resin layer has a multilayer structure, the Martens hardness of the resin layer is defined as the average of the Martens hardness values of layers that constitute the resin layer. The resin layer 13 more preferably has a minimum Martens hardness of 5 MPa or more, 15 MPa or more, or 30 MPa or more, while the resin layer 13 more preferably has a maximum Martens hardness of 90 MPa or less, 80 MPa or less, or 70 MPa or less.

The resin layer 13 has a film thickness of 10 μm or more. The film thickness of the resin layer should be measured in the same manner as the film thickness of the hard coat layer. The lower limit of the resin layer 13 is preferably 30 μm or more, 50 μm or more, 100 μm or more, or 150 μm or more in view of providing more excellent impact resistance. The upper limit of the resin layer 13 is preferably 500 μm or less or 300 μm or less in view of being suitable for thickness reduction and of good workability.

The resin as a component of the resin layer 13 is not specifically limited, provided that the resin has a Martens hardness within the range from 1 MPa to 100 MPa. Examples of such a resin include urethane resins, epoxy resins, acrylic gels, urethane gels, and silicone gels. Among those resins, acrylic gels are preferred. The "gel" generally refers to a disperse system with high viscosity and no fluidity. Additionally, the resin layer 13 may contain a rubber or a thermoplastic elastomer in addition to, for example, an acrylic gel or a urethane resin.

(Urethane Resin)

The urethane resin is a resin having urethane linkages. Examples of the urethane resin include a cured product of a radiation-curable urethane resin composition and a cured product of a thermosetting urethane resin composition. The urethane resin is preferably a cured product of a radiation-curable urethane resin composition, among those urethane resin compositions, because the cured product provides high hardness and is also highly mass-producible due to the fast cure rate.

The radiation-curable urethane resin composition contains urethane (meth)acrylate, while the thermosetting urethane resin contains a polyol compound and an isocyanate compound. The urethane (meth)acrylate, the polyol compound, and the isocyanate compound may each be a monomer, oligomer, or prepolymer.

The number of (meth)acryloyl groups (number of functional groups) in the urethane (meth)acrylate is preferably 2 or more and 4 or less. In cases where the number of (meth)acryloyl groups in the urethane (meth)acrylate is less than 2, the optical film is likely to have a lower level of pencil hardness; additionally, in cases where the number of (meth)acryloyl groups in the urethane (meth)acrylate is more than 4, the optical film is curled due to high cure shrinkage and is also likely to be cracked in the resin layer when being folded. The maximum number of (meth)acryloyl groups in the urethane (meth)acrylate is more preferably 3 or less. Both "acryloyl group" and "methacryloyl group" are meant by the word "(meth)acryloyl group."

The weight average molecular weight of the urethane (meth)acrylate is preferably 1,500 or more and 20,000 or less. In cases where the weight average molecular weight of the urethane (meth)acrylate is less than 1,500, the optical film is likely to have a reduced impact resistance; additionally, in cases where the weight average molecular weight of the urethane (meth)acrylate is more than 20,000, the radiation-curable urethane resin composition is likely to have an increased viscosity and result in reduced coating performance. The minimum weight average molecular weight of the urethane (meth)acrylate is more preferably 2,000 or more, while the maximum weight average molecular weight of the urethane (meth)acrylate is more preferably 15,000 or less.

Additionally, examples of the repeating unit having a structure derived from urethane (meth)acrylate include structures represented by the general formulae (25), (26), (27), and (28).

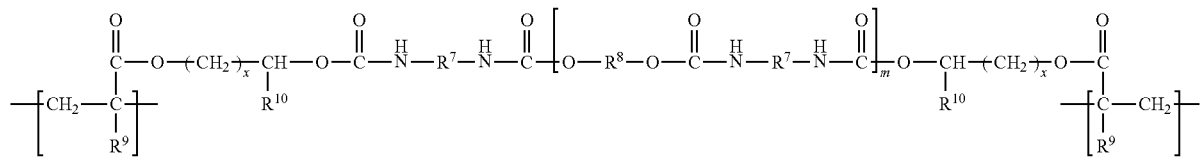

(25)

In the above-described general formula (25), $R^7$ represents a branched alkyl group; $R^8$ represents a branched alkyl group or a saturated alicyclic group; $R^9$ represents a hydrogen atom or methyl group; $R^{10}$ represents a hydrogen atom, methyl group, or ethyl group; m represents an integer of 0 or more; x represents an integer of 0 to 3.

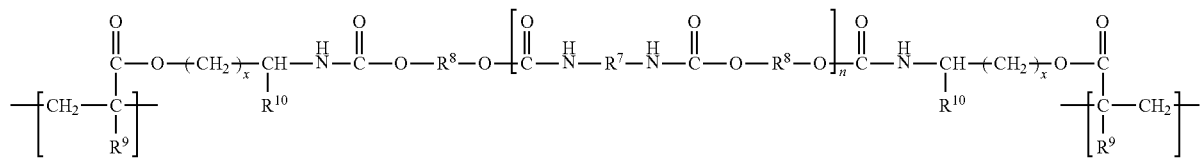

(26)

In the above-described general formula (26), $R^7$ represents a branched alkyl group; $R^8$ represents a branched alkyl group or a saturated alicyclic group; $R^9$ represents a hydrogen atom or methyl group; $R^{10}$ represents a hydrogen atom, methyl group, or ethyl group; n represents an integer of 1 or more; x represents an integer of 0 to 3.

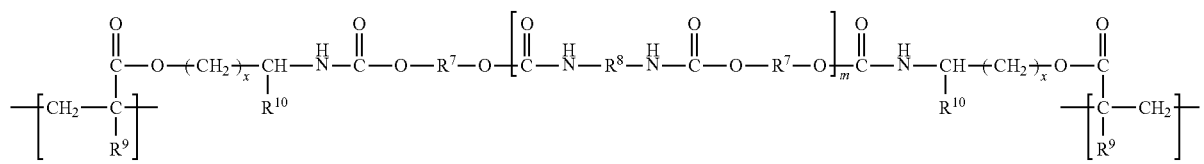

(27)

In the above-described general formula (27), $R^7$ represents a branched alkyl group; $R^8$ represents a branched alkyl group or a saturated alicyclic group; $R^9$ represents a hydrogen atom or methyl group; $R^{10}$ represents a hydrogen atom, methyl group, or ethyl group; m represents an integer of 0 or more; x represents an integer of 0 to 3.

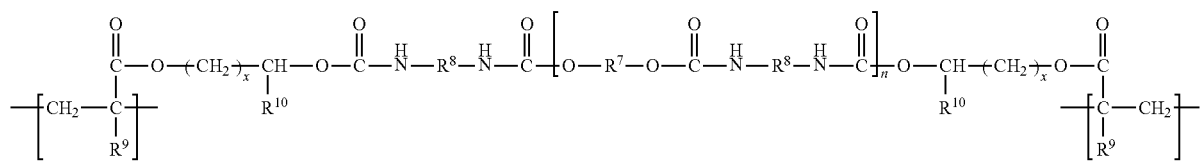

(28)

In the above-described general formula (28), $R^7$ represents a branched alkyl group; $R^8$ represents a branched alkyl group or a saturated alicyclic group; $R^9$ represents a hydrogen atom or methyl group; $R^{10}$ represents a hydrogen atom, methyl group, or ethyl group; n represents an integer of 1 or more; x represents an integer of 0 to 3.

Analysis of the resin layer 13 by, for example, pyrolysis GC-MS and FT-IR can determine the structure (repeating unit) of a polymer that forms the constituent resin of the resin layer 13. Particularly, pyrolysis GC-MS is so useful that monomer components contained in the resin layer 13 can be detected and identified.

The resin layer 13 may contain, for example, an ultraviolet absorber, a spectral transmittance modifier, an antifouling agent, inorganic particles, and/or organic particles, in addition to the above resin, provided that the resulting layer has a Martens hardness of 1 MPa or more and 100 MPa or less. The additional components, such as ultraviolet absorber, used in the resin layer can be the same as those described for the hard coat layer 12, and will not be described here.

(Acrylic Gel)

Various acrylic gels can be used as long as those acrylic gels are polymers produced by polymerization of monomers containing acrylic esters used in, for example, adhesives. Specifically, an acrylic gel obtained by polymerization or copolymerization of an acrylic monomer, such as ethyl (meth)acrylate, n-propyl (meth)acrylate, i-propyl (meth)acrylate, n-butyl (meth)acrylate, i-butyl (meth)acrylate, 2-ethylhexyl (meth)acrylate, n-hexyl (meth)acrylate, n-amyl (meth)acrylate, i-amyl (meth)acrylate, octyl (meth)acrylate, i-octyl (meth)acrylate, i-myristyl (meth)acrylate, lauryl (meth)acrylate, nonyl (meth)acrylate, i-nonyl (meth)acrylate, i-decyl (meth)acrylate, tridecyl (meth)acrylate, stearyl (meth)acrylate, or i-stearyl (meth)acrylate, can be used as the acrylic gel. In this specification, both "acrylate" and "methacrylate" are meant by the word "(meth)acrylate." The above-described acrylic esters used for the (co)polymerization may be used individually or in combination of two or more.

<<Decorative Layer>>

The decorative layer 14 is a layer that has a function to improve design quality. For example, the decorative layer 14 can be provided to hide, for example, electric wiring and thereby to improve design quality. The shape of the decorative layer 14 is not specifically limited, but includes, for example, frame shapes. The color of the decorative layer 14 is not specifically limited, but includes, for example, black and white.

The decorative layer 14 preferably has a film thickness of 1 μm or more and 20 μm or less. The decorative layer 14 with a film thickness of 1 μm or more can stably provide a sufficient level of design, while the decorative layer with a film thickness of 20 µm or less will prevent the optical film 10 from being too thick. The film thickness of the decorative layer should be measured in the same manner as the film thickness of the hard coat layer. The lower limit of the decorative layer 14 is more preferably 2 µm or more, or 5 µm or more, while the upper limit of the decorative layer 14 is more preferably 15 µm or less, 12 µm or less, or 10 µm or less.

The decorative layer 14 contains a coloring material and a binder resin. The decorative layer may contain other additives, in addition to the coloring material and the binder resin.

<Coloring Material>

The coloring material is not specifically limited, and, for example, coloring pigments, such as black pigments, white pigments, red pigments, yellow pigments, blue pigments, green pigments, and purple pigments, can be used. Only one of the coloring pigments may be used, or a combination of coloring pigments with the same color or with different colors may be used. Examples of the black pigment include carbon black, titanium black, titanium carbide, black iron oxide, titanium sesquioxide, and graphite. Examples of the white pigment include titanium dioxide, zinc oxide, lithopone, light calcium carbonate, precipitated silica, aluminium oxide, aluminium hydroxide, and barium sulfate.

<Binder Resin>

The binder resin is appropriately selected depending on the method of forming the decorative layer 14. In cases where the decorative layer 14 is formed by a printing technique, the binder resin may be a thermoplastic resin, a polymerized product (cured product) of a thermally polymerizable compound (thermocurable compound), or a polymerized product (cured product) or a radiation-polymerizable compound (radiation-curable compound). The radiation in the present specification includes visible light, ultraviolet light, X-rays, electron beams, α-rays, β-rays, and γ-rays.

(Thermoplastic Resin)

Examples of the thermoplastic resin include acrylic resins, vinyl acetate resins, acrylonitrile resins, vinyl chloride resins, polyethylene, and polypropylene.

(Thermally Polymerizable Compound)

Examples of the thermally polymerizable compound include acrylic compounds, epoxy compounds, polyester compounds, and polyimide compounds.

(Radiation-Polymerizable Compound)

Examples of the radiation-polymerizable compound include the polymerizable monomers and polymerizable oligomers listed in the above section of Hard Coat Layer.

<<Optical Film Production Method>>

The optical film 10 can be produced as follows. First, a first hard coat layer composition is applied on the first surface 11A of the light-transmitting base material 11 by a coating apparatus such as bar coater to form a coating film of the first hard coat layer composition.

<First Hard Coat Layer Composition>

The first hard coat layer composition contains a polymerizable compound for preparing the first hard coat layer 15. The first hard coat layer composition may additionally contain an ultraviolet absorber, a spectral transmittance modifier, an antifouling agent, inorganic particles, a leveling agent, a solvent, and a polymerization initiator, as necessary.

(Solvent)

Examples of the above-described solvent include alcohols (for example, methanol, ethanol, propanol, isopropanol, n-butanol, s-butanol, t-butanol, benzyl alcohol, PGME, ethylene glycol, diacetone alcohol), ketones (for example, acetone, methyl ethyl ketone, methyl isobutyl ketone, cyclopentanone, cyclohexanone, heptanone, diisobutyl ketone, diethyl ketone, diacetone alcohol), esters (methyl acetate, ethyl acetate, butyl acetate, n-propyl acetate, isopropyl acetate, methyl formate, PGMEA), aliphatic hydrocarbons (for example, hexane, cyclohexane), halogenated hydrocarbons (for example, methylene chloride, chloroform, carbon tetrachloride), aromatic hydrocarbons (for example, benzene, toluene, xylene), amides (for example, dimethylformamide, dimethylacetamide, N-methylpyrrolidone), ethers (for example, diethyl ether, dioxane, tetrahydrofuran), ether alcohols (for example, 1-methoxy-2-propanol), and carbonates (dimethyl carbonate, diethyl carbonate, ethylmethyl carbonate). These solvents may be used individually or in combination of two or more. Among those solvents, methyl isobutyl ketone and methyl ethyl ketone are preferred as the above-described solvent in terms of the ability to dissolve or disperse components such as urethane (meth)acrylate and other additives, whereby the first hard coat layer composition can be suitably applied.

(Polymerization Initiator)

The polymerization initiator is a component which degrades, when exposed to ionizing radiation, and generates radicals to initiate or promote polymerization (cross-linking) of a polymerizable compound.

The polymerization initiator is not specifically limited, to a particular polymerization initiator, provided that a substance that initiates a radical polymerization can be generated by exposure to ionizing radiation. Any known polymerization initiator can be used without any particular limitation, and specific examples include acetophenones, benzophenones, Michler's benzoyl benzoate, α-amyloxime esters, thioxantones, propyophenones, benzyls, benzoins, and acylphosphine oxides. Additionally, a photosensitizer is preferably mixed for use, and specific examples of the photosensitizer include n-butylamine, triethylamine, and poly-n-butylphosphine.

After the coating film of the first hard coat layer composition is prepared, the coating film is heated and dried at a temperature of, for example, 30° C. or higher and 120° C. or lower for a period of 10 to 120 seconds by various known techniques to evaporate the solvent.

After drying the coating film, the coating film is exposed to ionizing radiation such as ultraviolet light to semi-cure (half cure) the coating film. The term "semi-cured" as used herein means that curing substantially proceeds upon further exposure to ionizing radiation. However, the coating film may be completely cured (full-cured) at this step. The phrase "completely cured" as used herein means that curing substantially no more proceeds in spite of further exposure to ionizing radiation.

After the coating film is semi-cured, a second hard coat layer composition to form the second hard coat layer 16 is applied on the coating film by a coating apparatus such as bar coater to prepare a coating film of the second hard coat layer composition.

<Second Hard Coat Layer Composition>

The second hard coat layer composition contains a polymerizable compound for preparing the second hard coat layer 16. The second hard coat layer composition may additionally contain an ultraviolet absorber, a solvent, and a polymerization initiator, as necessary. The content of total solids in the second hard coat layer composition is preferably from 25 to 55%, similarly to the first hard coat layer composition. The solvent and the polymerization initiator are the same as those described for the first hard coat layer composition, and will not be described here.

After the coating film of the second hard coat layer composition is formed, the coating film is heated and dried at a temperature of, for example, 30° C. or higher and 120° C. or lower for a period of 10 to 120 seconds by various known techniques to evaporate the solvent.

After drying the coating film, the coating film of the second hard coat layer composition is exposed to ionizing radiation such as ultraviolet light to completely cure (full-cure) the first and second hard coat layer compositions for the formation of the first hard coat layer 15 and the second hard coat layer 16, and the hard coat layer 12 is thereby obtained.

After forming the hard coat layer 12, a resin layer composition for forming a resin layer 13 is applied on the second surface 11B of the light-transmitting base material 11 by a coating apparatus such as bar coater to form a coating film of the resin layer composition, after which the resin layer 13 is formed by curing the coating film.

<Resin Layer Composition>

In cases where the resin layer 13 is composed of a urethane resin, for example, any of the radiation-curable urethane resin compositions described in the above section of Urethane resin can be used in the resin layer composition.

After forming the resin layer 13, a decorative layer composition is applied on the surface of the resin layer 13 by, for example, a printing technique to form a coating film. Subsequently, the coating film is exposed to heat or radiation as necessary to form a decorative layer 14, and the optical film 10 shown in FIG. 1 is thereby obtained.

<<Other Optical Films>>

Although the optical film 10 shown in FIG. 1 comprises a hard coat layer 12, a light-transmitting base material 11, a resin layer 13, and a decorative layer 14 arranged in this order, optical films with any of the structures shown in FIGS. 3 to 6 may also be included. In FIGS. 3 to 6, the elements indicated by the same reference numbers as in FIG. 1 are the same as those indicated in FIG. 1, and will not be described here.

The optical films 30, 40, 50, and 60 shown in FIGS. 3 to 6 have, similarly to the optical film 10, front surfaces 30A, 40A, 50A, and 60A and back surfaces 30B, 40B, 50B, and 60B opposite to the front surfaces 30A, 40A, 50A, and 60A, respectively. Each of the optical films 30, 40, and 50 comprises a light-transmitting base material 11, a hard coat layer 12, a resin layer 13, and a decorative layer 14, wherein the hard coat layer 12 is provided closer to the front surface 30A, 40A, or 50A of the optical films 30, 40, or 50 than the light-transmitting base material 11, the resin layer 13, and the decorative layer 14. The optical film 60 comprises a hard coat layer 12, a resin layer 13, and a decorative layer 14, wherein the hard coat layer 12 is provided closer to the front surface 60A of the optical film 60 than the resin layer 13 and the decorative layer 14. The features, such as physical properties, of the optical films 30, 40, 50, and 60 are similar to those of the optical film 10.

Figure 3:
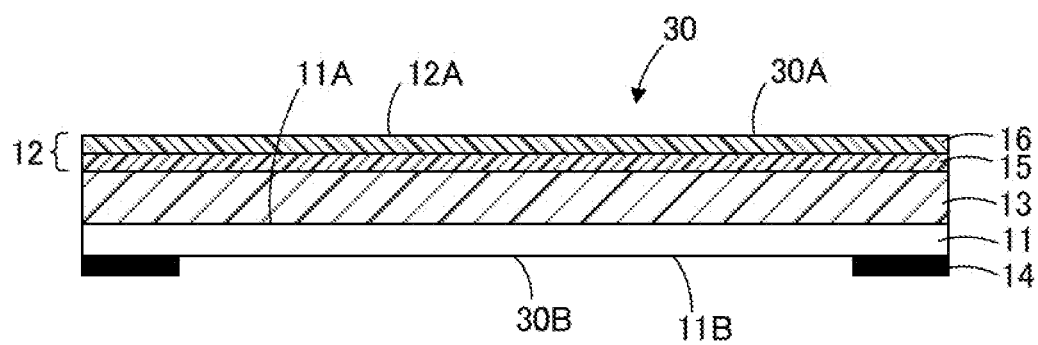
FIG. 3 shows a schematic diagram of another optical film according to the first embodiment.

In the optical film 30 shown in FIG. 3, the resin layer 13 is provided closer to the front surface 30A than the decorative layer 14, similarly to the optical film 10. Specifically, the optical film 30 comprises the hard coat layer 12, the resin layer 13, the light-transmitting base material 11, and the decorative layer 14 arranged in this order from the front surface 30A to the back surface 30B. In FIG. 3, the front surface 30A of the optical film 30 corresponds to the surface 12A of the hard coat layer 12, and the back surface 30B of the optical film 30 corresponds to the surface of the decorative layer 14 and a part of the second surface 11B of the light-transmitting base material 11.

Figure 4:
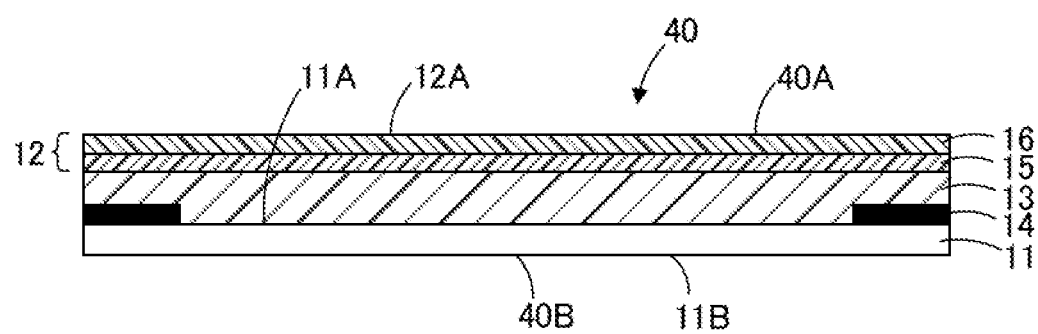
FIG. 4 shows a schematic diagram of another optical film according to the first embodiment.

In the optical film 40 shown in FIG. 4, the resin layer 13 is provided closer to the front surface 40A than the decorative layer 14, similarly to the optical film 10. Specifically, the optical film 40 comprises the hard coat layer 12, the resin layer 13, and the light-transmitting base material 11 arranged in this order from the front surface 40A to the back surface 40B, and the decorative layer 14 is provided between the resin layer 13 and the light-transmitting base material 11. In FIG. 4, the front surface 40A of the optical film 40 corresponds to the surface 12A of the hard coat layer 12, and the back surface 40B of the optical film 40 corresponds to the second surface 11B of the light-transmitting base material 11.

Figure 5:
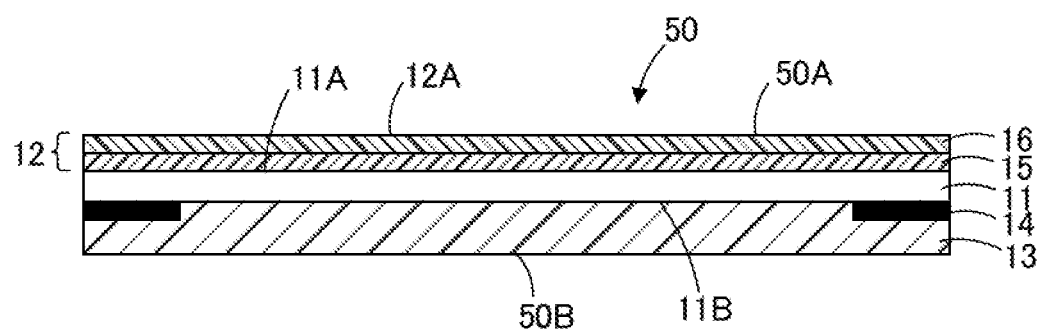
FIG. 5 shows a schematic diagram of another optical film according to the first embodiment.

In the optical film 50 shown in FIG. 5, the resin layer 13 is not provided closer to the front surface 50A than the decorative layer 14, differently from the optical film 10. Specifically, the optical film 50 comprises the hard coat layer 12, the light-transmitting base material 11, and the resin layer 13 arranged in this order from the front surface 50A to the back surface 50B, and the decorative layer 14 is provided between the light-transmitting base material 11 and the resin layer 13. In FIG. 5, the front surface 50A of the optical film 50 corresponds to the surface 12A of the hard coat layer 12, and the back surface 50B of the optical film 50 corresponds to the surface of the resin layer 13.

Figure 6:
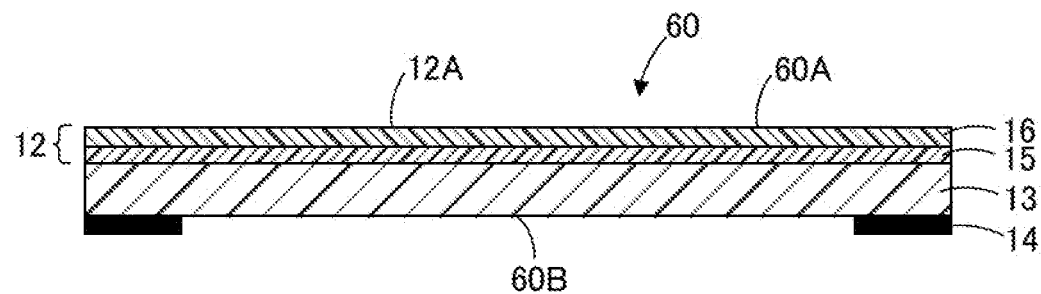
FIG. 6 shows a schematic diagram of another optical film according to the first embodiment.

The optical film 60 shown in FIG. 6 comprises no light-transmitting base material, differently from the optical film 10. The optical film 60 comprises the hard coat layer 12, the resin layer 13, and the decorative layer 14 arranged in this order from the front surface 60A to the back surface 60B. Additionally, another optical film may comprise a hard coat layer 12, a decorative layer 14, and a resin layer 13 arranged in this order from the front surface to the back surface.

<<<Image Display Device>>>

Figure 7:
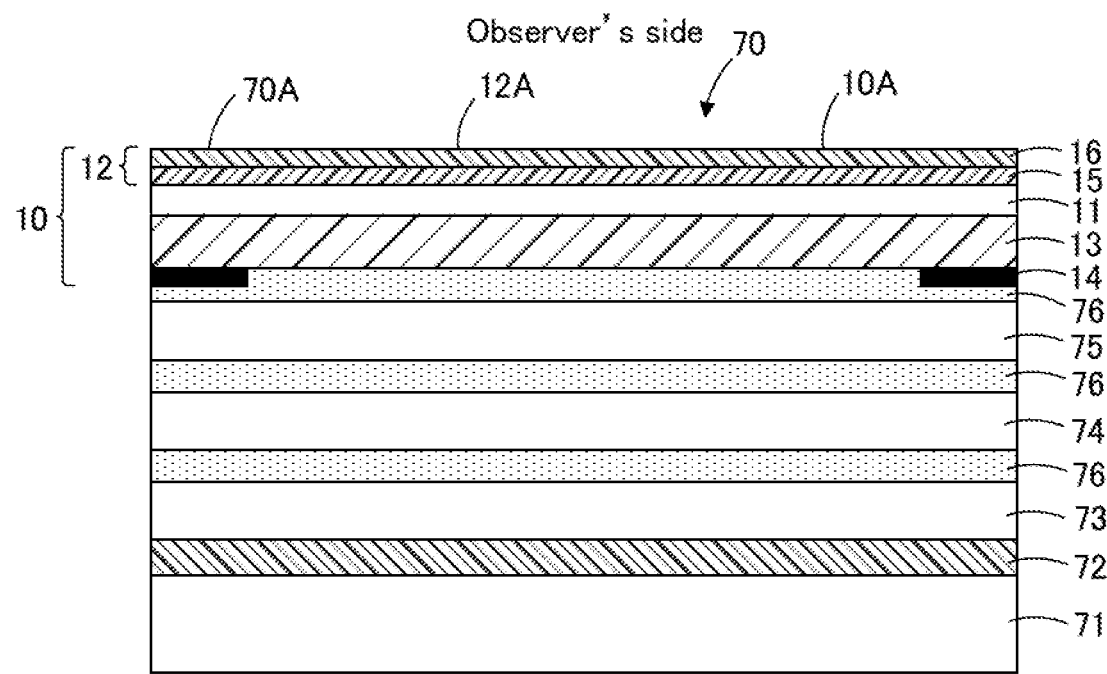
FIG. 7 shows a schematic diagram of an image display device according to the first embodiment.

The optical film 10 may be incorporated into a foldable image display device and then used. FIG. 7 shows a schematic diagram of an image display device according to the present embodiment. As shown in FIG. 7, the image display device 70 generally comprises a housing 71 for accommodating, for example, a battery, a protective film 72, a display panel 73, a polarizing plate 74, a touch sensor 75, and the optical film 10 laminated in this order toward the observer's side. Light-transmitting adhesive layers 76 are placed along the interfaces between the display panel 73 and the polarizing plate 74, between the polarizing plate 74 and the touch sensor 75, and between the touch sensor 75 and the optical film 10, and these components are anchored to each other with the adhesive layers 76. Although the adhesive layers 76 are placed along the interfaces between the display panel 73 and the polarizing plate 74, between the polarizing plate 74 and the touch sensor 75, and between the touch sensor 75 and the optical film 10, the position where each adhesive layer is located is not specifically limited as long as the position is between the optical film and the display panel.

In the optical film 10, the hard coat layer 12 is located on the observer's side of the light-transmitting base material 11. For the image display device 70, the front surface 10A of the optical film 10 (the surface 12A of the hard coat layer 12) is configured to be the surface 70A of the image display device 70.

In the image display device 70, the display panel 73 is an organic light-emitting diode panel containing, for example, an organic light-emitting diode. Because the display panel 73 is an organic light emitting diode panel, the polarizing plate 74 should be a circularly polarizing plate. The touch sensor 75 is located between the polarizing plate 74 and the optical film 10, but may be located between the display panel 73 and the polarizing plate 74. Additionally, the touch sensor 75 may be an on-cell type or an in-cell type.

As the adhesive layer 76, for example, an OCA (optical clear adhesive) can be used, and an adhesive layer composed of the above-described acrylic gel is preferably used in view of increasing the impact resistance to prevent any damage on the display panel 73. Additionally, in cases where the resin layer 13 is composed of the above acrylic gel, the touch sensor 75 can be anchored to the optical film 10 not by providing the adhesive layer 76 along the interface between the touch sensor 75 and the optical film 10, but by directly laminating the resin layer 13 to the touch sensor 75, because the above acrylic gel is adhesive.

The shear loss tangent (tan δ) is conventionally known as an index representing the impact-absorbing capacity. Thus, the impact resistance of an optical film is considered to be expressed by a value of shear loss tangent (tan δ). However, the optical film failed to prevent the formation of depression on the surface of the optical film and that attributed to the adhesive layer and of damage to a component located interior to the optical film in an image display device, upon impact on the surface of the optical film, on the basis of a value of the shear loss tangent (tan δ). This is considered to be related to the fact that the shear loss tangent (tan δ) is the ratio (G"/G') between the elastic shear loss modulus (G") and the elastic shear storage modulus (G'). The inventors intensively studied this topic and consequently found that the formation of depression on the surface of the optical film attributed to the optical film itself and to the adhesive layer and of damage to a component located interior to the optical film in an image display device could be prevented upon impact on the surface of the optical film, if the optical film comprised a hard coat layer provided closer to the front surface of the optical film and also a resin layer with a Martens hardness of 1 MPa or more and 100 MPa or less and a film thickness of 10 µm or more. According to the present embodiment, the optical film 10 comprises the hard coat layer 12 provided closer to the front surface 10A and also comprises the resin layer 13 with a Martens hardness of 1 MPa or more and 100 MPa or less and a film thickness of 10 µm or more, and can thus prevent formation of depression on the front surface 10A attributed to the optical film 10 itself and that on the front surface 10A of the optical film 10 attributed to the adhesive layer, and of damage to components located interior to the optical film 10 in the image display device, upon impact on the front surface 10A of the optical film 10. Furthermore, the optical film 10 comprises the decorative layer 14 and can thus improve design quality. This can provide the foldable optical film 10 with excellent impact resistance and with capability to improve design quality. Additionally, the foldable optical films 30, 40, 50, and 60 can be provided with excellent impact resistance and with capability to improve design quality for the same reasons.

In the optical film 10, the resin layer 13 is provided closer to the front surface 10A of the optical film 10 than the decorative layer 14, and the resin layer 13 can absorb impact when an impact force is applied on the optical film 10 from the front surface 10A. This enables prevention of crack formation in the decorative layer 14, which is located closer to the back surface 10B than the resin layer 13. Additionally, the optical films 30, 40, and 60 can prevent crack formation in the decorative layer 14 when an impact force is applied to the optical film 30, 40, and 60 from the front surface 30A, 40A, and 60A, respectively, for the same reasons.

In the optical film 50, the decorative layer 14 is provided inside the optical film 50, specifically between the light-transmitting base material 11 and the resin layer 13, which can reduce the elongation of the decorative layer 14 when the optical film 50 is folded in such a manner that the front surface 50A of the optical film 50 faces inward, as compared to optical films with a decorative layer exposed on the back surface, similarly to the optical film 10 and the like. This can prevent breakage of the decorative layer 14 when it is folded.

In the image display device 70, the resin layer 13 is provided closer to the observer's side than the polarizing plate 74, which allows the resin layer 13 to absorb impact when an impact force is applied to the image display device 70 from the surface 70A. This enables the polarizing plate 74 to prevent crack formation, which is located interior to the resin layer 13. Additionally, the optical films 30, 40, 50, and 60 can prevent light leakage due to crack formation, deformation, or breakage in the polarizing plate 74 even when an impact force is applied from the surface of the image display device, for the same reasons.

Second Embodiment

Figure 8:
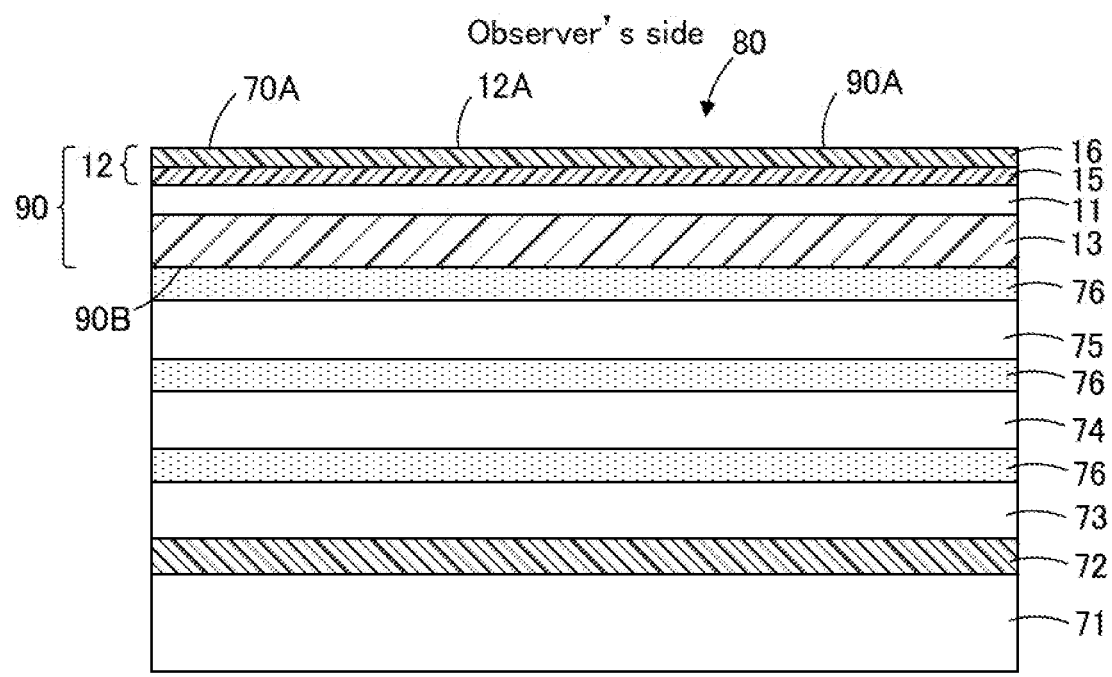
FIG. 8 shows a schematic diagram of an image display device according to the second embodiment.
Figure 9:
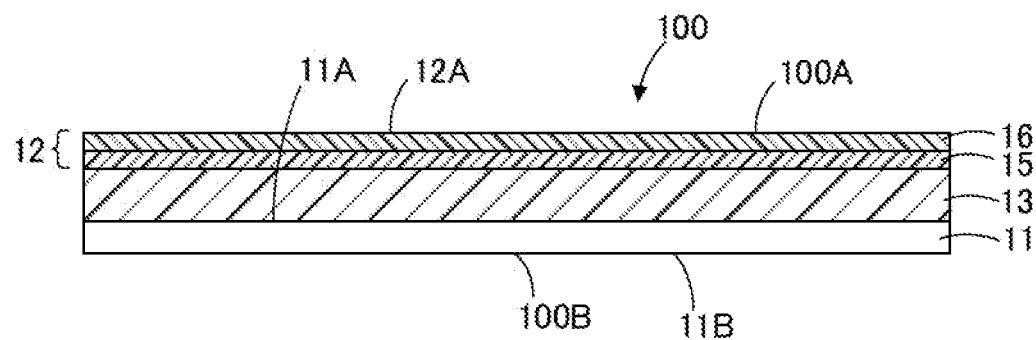
FIG. 9 shows a schematic diagram of another optical film incorporated in the image display device according to the second embodiment.
Figure 10:
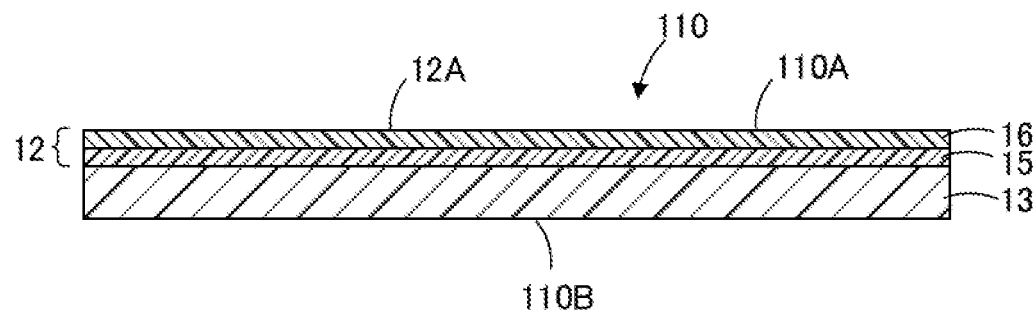
FIG. 10 shows a schematic diagram of another optical film incorporated in the image display device according to the second embodiment.
Figure 11:
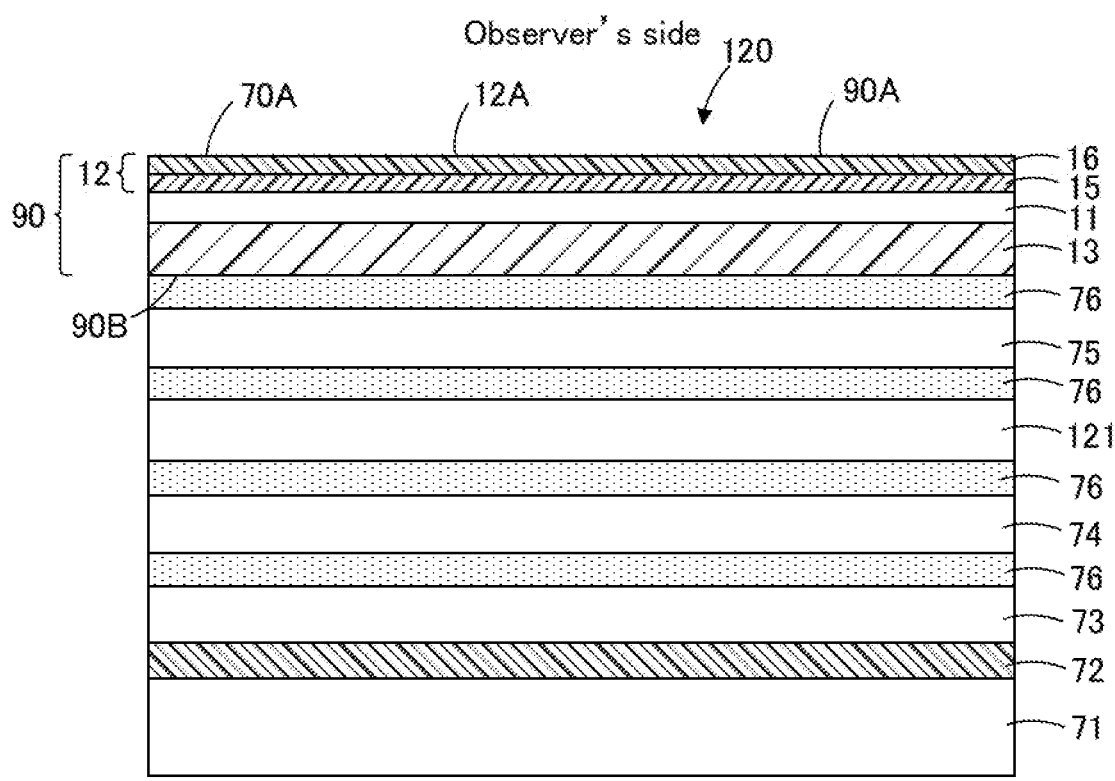
FIG. 11 shows a schematic diagram of another image display device according to the second embodiment.

An optical film, a laminate, a polarizing plate and an image display device according to the second embodiment of the present invention will be described with reference to the drawings. FIG. 8 shows a schematic diagram of an image display device according to the present embodiment, and FIGS. 9 and 10 show schematic diagrams of other optical films incorporated in the image display device according to the present embodiment, and FIG. 11 shows a schematic diagram of another image display device according to the present embodiment.

<<<Image Display Device>>>

The image display device 80 shown in FIG. 8 generally comprises a housing 71 for accommodating, for example, a battery, a protective film 72, a display panel 73, a polarizing plate 74, a touch sensor 75, and an optical film 90 laminated in this order toward the observer's side. Light-transmitting adhesive layers 76 are placed along the interfaces between the display panel 73 and the polarizing plate 74, between the polarizing plate 74 and the touch sensor 75, and between the touch sensor 75 and the optical film 90, and these components are anchored to each other with the adhesive layers 76. Although the adhesive layers 76 are placed along the interfaces between the display panel 73 and the polarizing plate 74, between the polarizing plate 74 and the touch sensor 75, and between the touch sensor 75 and the optical film 90, the position where each adhesive layer is located is not specifically limited as long as the position is between the optical film and the display panel. In FIG. 8, the elements indicated by the same reference numbers as in FIG. 7 are the same as those indicated in FIG. 7, and will not be described here.

<<Optical Film>>

The optical film 90 shown in FIG. 8 is different from the optical film 10 in that the former comprises no decorative layer. Specifically, the optical film 90 comprises a light-transmitting base material 11, a hard coat layer 12, and a resin layer 13. In the optical film 90, the hard coat layer 12 is provided closer to the observer's side than the light-transmitting base material 11 and the resin layer 13. In FIG. 8, the optical film 90 comprises the hard coat layer 12, the light-transmitting base material 11 and the resin layer 13 arranged in this order toward the polarizing plate 74. However, when the hard coat layer is located closer to the observer's side than the light-transmitting base material and resin layer, the order of arrangement of the light-transmitting base material and the resin layer is not specifically limited. In FIG. 8, a front surface 90A of the optical film 90 correspond to the surface 12A of the hard coat layer 12, and a back surface 90B of the optical film 90 corresponds to the surface of the resin layer 13.

<<Other Optical Films>>

Although the optical film 90 shown in FIG. 8 comprises a hard coat layer 12, a light-transmitting base material 11, and a resin layer 13 arranged in this order, optical films with any of the structures shown in FIGS. 9 and 10 may also be included. In FIGS. 9 and 10, the elements indicated by the same reference numbers as in FIG. 1 are the same as those indicated in FIG. 1, and will not be described here.

The optical films 100 and 110 shown in FIGS. 9 and 10 have, similarly to the optical film 10, front surfaces 100A and 110A and back surfaces 100B and 110B opposite to the front surfaces 100A and 110A, respectively. The optical film 100 comprises a light-transmitting base material 11, a hard coat layer 12, and a resin layer 13, wherein the hard coat layer 12 is provided closer to the front surface 100A of the optical film 100 than the light-transmitting base material 11 and the resin layer 13. The optical film 110 comprises a hard coat layer 12 and a resin layer 13, wherein the hard coat layer 12 is provided closer to the front surface 110A of the optical film 110 than the resin layer 13. The features, such as physical properties, of the optical films 100 and 110 are similar to those of the optical film 10.

The optical film 100 comprises the hard coat layer 12, the resin layer 13, and the light-transmitting base material 11 arranged in this order from the front surface 100A to the back surface 100B. That is, in cases where the optical film 100 is incorporated, instead of the optical film 90, into the image display device 80 shown in FIG. 8, the optical film 100 comprises the hard coat layer 12, the resin layer 13, and the light-transmitting base material 11 arranged in this order toward the polarizing plate 74. In FIG. 9, the front surface 100A of the optical film 100 corresponds to the surface 12A of the hard coat layer 12, and the back surface 100B of the optical film 100 corresponds to the second surface 11B of the light-transmitting base material 11.

The optical film 110 shown in FIG. 10 comprises no light-transmitting base material, differently from the optical film 90. The optical film 110 comprises the hard coat layer 12 and the resin layer 13 arranged in this order from the front surface 110A to the back surface 110B. That is, in cases where the optical film 110 is incorporated, instead of the optical film 90, into the image display device 80 shown in FIG. 8, the optical film 110 comprises the hard coat layer 12 and the resin layer 13 arranged in this order toward the polarizing plate 74. In FIG. 10, the front surface 110A of the optical film 110 corresponds to the surface 12A of the hard coat layer 12, and the back surface 110B of the optical film 110 corresponds to the surface of the resin layer 13.

<<Other Image Display Devices>>

Although the image display device 80 shown in FIG. 8 comprises no light-transmitting film with an in-plane phase difference of 3,000 nm or more located closer to the observer's side than the polarizing plate 74, image display devices may comprise a light-transmitting film 121 with an in-plane phase difference (Re: retardation) of 3,000 nm or more located closer to the observer's side than a polarizing plate 74, similarly to the image display device 120 shown in FIG. 11.

<Light-Transmitting Film>

The location of the light-transmitting film 121 in an image display device is not specifically limited, provided that the light-transmitting film is located closer to the observer's side than the polarizing plate 74; however, the light-transmitting film is preferably located between a resin layer 13 and a polarizing plate 74 in view of providing excellent impact resistance. In the image display device 120 shown in FIG. 11, a light-transmitting film 121 is located between a polarizing plate 74 and a touch sensor 75, and is attached to the polarizing plate 74 and to the touch sensor 75 through adhesive layers 76.

The light-transmitting film 121 has an in-plane phase difference of 3,000 nm or more, as described above. The light-transmitting film 121 preferably has a minimum in-plane phase difference of 6,000 nm or more, or 8,000 nm or more, in view of further preventing the formation of colorful interference pattern, and more preferably has a maximum in-plane phase difference of 25,000 nm or less, or 20,000 nm or less, in view of reducing the thickness of the light-transmitting film 121.

The in-plane phase difference (Re; unit: nm) of the light-transmitting film 121 is expressed by the following formula (1), which is composed of the refractive index (nx) in a direction where the refractive index is the highest in the plane of the light-transmitting film 121 (slow axis direction), the refractive index (ny) in a direction (fast axis direction) perpendicular to the slow axis direction, and the thickness d (unit: nm) of the light-transmitting film:

$$Re=(nx-ny)\times d \qquad (1).$$

The in-plane phase difference of the light-transmitting film 121 can be measured, for example, in the environment with a temperature of 23±5° C. and a relative humidity of 30% or more and 70% or less by using KOBRA-WR manufactured by Oji Scientific Instruments and setting the measurement angle to 0° and the measurement wavelength to 548.2 nm. Additionally, the in-plane phase difference can also be determined by the following method. First of all, the refractive indexes (nx, ny) in the directions along the two axes can be determined by an Abbe refractometer (product name: "NAT-4T"; manufactured by ATAGO Co., Ltd.), where the first direction is the direction corresponding to the orientation of the light-transmitting base material determined using two polarizing plates and the second direction is the direction perpendicular to the direction corresponding to the orientation. In this respect, an axis on which the higher of the refractive indexes is provided is defined as the slow axis. Moreover, the thickness of the light-transmitting film is measured using, for example, an electronic micrometer (manufactured by Anritsu Corporation). Then, the difference in refractive index (nx−ny; "nx−ny" is hereinafter referred to as Δn) is calculated using the obtained refractive indexes. The refractive index difference Δn can be multiplied by the thickness d (nm) of the light-transmitting film to determine the in-plane phase difference.

The refractive index difference Δn is preferably 0.05 or more and 0.20 or less in view of allowing the light-transmitting film 121 to have an in-plane phase difference of 3,000 nm or more. When the refractive index difference Δn is 0.05 or more, the thickness of the light-transmitting film is relatively thin, which allows the light-transmitting film to have an in-plane phase difference as described above. In contrast, when the refractive index difference Δn is 0.20 or less, the draw ratio is not needed to be increased excessively to allow the light-transmitting film to prevent damages, such as crack or breakage, which can prevent the light-transmitting film as an industrial material from reducing the utility. Preferably, the lower and upper limits of the refractive index difference Δn are a value of 0.07 or more and a value of 0.15 or less, respectively. In cases where the refractive index difference Δn is more than 0.15, the light-transmitting film 121 may exhibit poor durability during a test of humidity and heat resistance depending on the type of the light-transmitting film 121. The upper limit of the refractive index difference Δn is more preferably 0.12 or less in view of providing excellent durability during a test of humidity and heat resistance.

Additionally, the refractive index nx of the light-transmitting film 121 in the slow axis direction is preferably 1.60 or more and 1.80 or less. The influence of colorful interference pattern formation can be reduced when the refractive index nx is 1.60 or more, while the formation of interference fringes can be prevented when the refractive index nx is 1.80 or less. More preferably, the lower and upper limits of the refractive index nx are a value of 1.65 or more and a value of 1.75 or less, respectively.

Additionally, the refractive index ny of the light-transmitting film 121 in the fast axis direction is preferably 1.50 or more and 1.70 or less. The influence of colorful interference pattern formation can be reduced when the refractive index ny is 1.50 or more, while the formation of interference fringes can be prevented when the refractive index ny is 1.70 or less. More preferably, the lower and upper limits of the refractive index ny are a value of 1.55 or more and a value of 1.65 or less, respectively.

The thickness of the light-transmitting film 121 is not specifically limited, but can normally be 5 μm or more and 1,000 μm or less. The minimum thickness of the light-transmitting film 121 is preferably 15 μm or more, more preferably 25 μm or more, in view of the handling ability. The maximum thickness of the light-transmitting film 121 is preferably 80 μm or less in view of reducing the film thickness.

The light-transmitting film 121 is not specifically limited, provided that it has an in-plane phase difference of 3,000 nm or more; and the light-transmitting film includes films containing, for example, a polyester resin, an acrylic resin, a polycarbonate resin, a cycloolefin polymer resin, or a mixture thereof. Among those, a light-transmitting film containing a polyester resin is preferred in terms of cost and mechanical strength.

In cases where a polyester base material is used as the light-transmitting film 121, the polyester base material preferably has a thickness of 15 μm or more and 500 μm or less. When the polyester base material has a thickness of 15 μm or more, the polyester base material can have an in-plane phase difference of 3,000 nm or more and also lead to weakened anisotropy of mechanical properties, which prevents damages, such as crack or breakage, and can prevent the light-transmitting film as an industrial material from reducing the utility. Moreover, when the polyester base material has a thickness of 500 μm or less, the light-transmitting film as an industrial material can be prevented from decreasing the flexibility unique to a polymer film and from reducing the utility. More preferably, the above polyester base material has a minimum thickness of 50 μm or more and a maximum thickness of 400 μm or less or 300 μm or less.

Examples of the polyester resin include polyethylene terephthalate, polyethylene isophthalate, polybutylene terephthalate, poly(1,4-cyclohexylene dimethylene terephthalate), and polyethylene-2,6-naphthalate resins. These polyester resins can be copolymers or may be blends composed of any of the above polyesters as a main component (for example, in a ratio of 80% by mole or more) and another resin as a minor component (for example, in a ratio of 20% by mole or less). As the polyester resin, polyethylene terephthalate or polyethylene-2,6-naphthalate is preferred due to its good balance in features, such as mechanical and optical properties, and polyethylene terephthalate (PET), among those, is particularly preferred due to its high versatility and easy accessibility. Furthermore, polyethylene terephthalate has excellent transparency and thermal or mechanical properties, which enable control of in-plane phase difference by drawing process, and polyethylene terephthalate has a high intrinsic birefringence, which yields a relatively high in-plane phase difference even with a thin film thickness.

The method of yielding a light-transmitting film containing a polyester resin and having an in-plane phase difference of 3,000 nm or more includes a method in which a polyester resin such as polyethylene terephthalate is melted and extruded to form an unstretched polyester sheet and the resulting polyester sheet is stretched in the lateral direction using, for example, a tenter at a temperature equal to or above the glass transition temperature and then heated. The above lateral drawing temperature is preferably 80° C. or higher and 130° C. or lower. More preferably, the lower and upper limits of the lateral drawing temperature are a temperature of 90° C. or higher and a temperature of 120° C. or lower, respectively. Additionally, the lateral draw ratio is preferably 2.5 or more and 6.0 or less. The draw tension is increased when the lateral draw ratio is 2.5 or more, which in turn allows the resulting polyester base material to have a high birefringence and to avoid increasing the thickness for the purpose of providing a desired in-plane phase difference. Moreover, when the above lateral draw ratio is 6.0 or less, the resulting light-transmitting film can be prevented from reducing the transparency. More preferably, the lower and upper limits of the lateral draw ratio are a ratio of 3.0 or more and a ratio of 5.5 or less, respectively.

Additionally, in the extrusion of a polyester resin to form a sheet, the sheet may be stretched in the feed direction (machine direction), namely in the longitudinal direction. In this case, the above sheet is preferably stretched longitudinally to a draw ratio of 2 or less, in view of providing the above refractive index difference Δn within the above preferred range. Instead of the longitudinal stretching during the extrusion molding, the above unstretched polyester sheet may be first stretched laterally under the above conditions, and then stretched longitudinally. Moreover, the temperature during the above heat treatment is preferably 100° C. or higher and 250° C. or lower. More preferably, the lower and upper limits of the temperature during the heat treatment are a temperature of 180° C. or higher and a temperature of 245° C. or lower, respectively.

The method of adjusting the in-plane phase difference of the polyester resin-containing light-transmitting film produced by the above-described method to a value of 3,000 nm or more includes a method in which the draw ratio, the drawing temperature, and/or the film thickness of the produced light-transmitting film are suitably selected. Specifically, for example, a high in-plane phase difference is more easily provided when the draw ratio is higher, or the drawing temperature is lower, or the film thickness is thicker, while a low in-plane phase difference is more easily provided when the draw ratio is lower, or the drawing temperature is higher, or the film thickness is thinner.

Examples of the acrylic resin include poly(methyl (meth)acrylate), poly(ethyl (meth)acrylate), and poly(methyl (meth)acrylate-co-butyl (meth)acrylate).

Examples of the polycarbonate resin bisphenol-based (for example, bisphenol A-based) aromatic polycarbonates, and aliphatic polycarbonate such as diethylene glycol bis(allyl carbonate).

Examples of the cycloolefin polymer resin include polymers of, for example, norbornene monomers and monocycloolefin monomers.

The refractive index of the light-transmitting film 121 can be 1.40 or more 1.80 or less. The "refractive index of the light-transmitting base material" in this context will refer to an average refractive index.

The light-transmitting film 121 can prevent the formation of colorful interference pattern, no matter what angle the slow axis of the light-transmitting film 121 forms with the absorption axis of the polarizing plate, but the light-transmitting film is preferably located in such a manner that the angle is 0°±30° or 90°±30°. Such arrangement of the light-transmitting film 121 can greatly prevent the formation of colorful interference pattern in an image displayed on the image display device.

The light-transmitting film 121 is preferably located in such a manner that the angle between the slow axis of the light-transmitting film 121 and the absorption axis of the polarizing plate is 45°±15°. Such arrangement of the light-transmitting film 121 can provide good identifiability even when the image display device is observed through polarized sunglasses.

According to the present embodiment, the optical film 90 comprises the hard coat layer 12 closer to the front surface 90A and also comprises the resin layer 13 with a Martens hardness of 1 MPa or more and 10 MPa or less and a film thickness of 10 μm or more, and can thus prevent formation of depression on the front surface 90A of the optical film 90 and of damage to components (in particular, the polarizing plate 74) located interior to the optical film 90 in the image display device 80, upon impact on the surface 80A of the image display device. Accordingly, the image display device 80 with excellent impact resistance can be provided. Additionally, image display devices comprising the optical film 100 or 110 and the image display device 120 have excellent impact resistance for the same reasons.

Light-transmitting base materials used in foldable optical films are often composed of a birefringent material, such as a polyimide resin. When an optical film comprising a light-transmitting base material composed of such a birefringent material is incorporated into an image display device, a pattern of different colors (colorful interference pattern), which is formed due to the phase difference imparted by the birefringent material, is likely to be observed. The colorful interference pattern is more easily observed when an image on the display is observed through polarized sunglasses, than when the same image is observed by naked eyes. In contrast, according to the present embodiment, the use of a light-transmitting film 121 with an in-plane phase difference of 3,000 nm or more can prevent formation of colorful interference pattern even though it is a light-transmitting film composed of a birefringent material. This is because a higher phase difference causes various wavelengths of light to interfere with each other, which mixes different colors of light and thus makes a colorful interference pattern less visible. Accordingly, the colorful interference pattern can be less identifiable not only when an image on the display is observed by naked eyes, but also when it is observed through polarized sunglasses.

EXAMPLES

Now, the present invention will be described in more detail by way of examples. However, the present invention is not limited to those examples. The phrase "a converted value based on 100% solids" below means a value determined based on the assumption that the content of solids diluted in a solvent is 100%.

<Preparation of Hard Coat Layer Compositions>

First, the following components were combined to meet the composition requirements indicated below and thereby to obtain hard coat layer compositions.

(Hard coat layer composition 1)

A mixture of dipentaerythritol pentaacrylate and dipentaerythritol hexaacrylate (product name: "M403"; manufactured by Toagosei Co., Ltd.): 25 parts by mass;

EO-modified dipentaerythritol hexaacrylate (product name: "A-DPH-6E"; manufactured by Shin-Nakamura Chemical Co., Ltd.): 25 parts by mass;

Deformed silica particles (with an average particle diameter of 25 nm; manufactured by JGC C&C): 50 parts by mass (a converted value based on 100% solids);

Photopolymerization initiator (1-hydroxycyclohexyl phenyl ketone; product name: "Irgacure®184", manufactured by BASF Japan Ltd.): 4 parts by mass;

Fluorine-based leveling agent (product name: "F568"; manufactured by DIC Corporation): 0.2 parts by mass (a converted value based on 100% solids);

Methyl isobutyl ketone (MIBK): 150 parts by mass.

(Hard Coat Layer Composition 2)

Urethane acrylate (product name: "UX5000", manufactured by Nippon Kayaku Co., Ltd.): 25 parts by mass;

A mixture of dipentaerythritol pentaacrylate and dipentaerythritol hexaacrylate (product name: "M403"; manufactured by Toagosei Co., Ltd.): 50 parts by mass;

Polyfunctional acrylate polymer (product name: "Acrit 8KX-014"; manufactured by Taisei Fine Chemical Co., Ltd.): 25 parts by mass (a converted value based on 100% solids);

Antifouling agent (product name: "BYK-UV 3500"; manufactured by BYK Japan KK): 1.5 parts by mass (a converted value based on 100% solids);

Photopolymerization initiator (1-hydroxycyclohexyl phenyl ketone; product name: "Irgacure®184", manufactured by BASF Japan Ltd.): 4 parts by mass;

Methyl isobutyl ketone (MIBK): 150 parts by mass.

<Preparation of Resin Layer Compositions>

The following components were combined to meet the composition requirements indicated below and thereby obtain resin layer compositions.

(Resin Layer Composition 1)

Urethane acrylate (product name: "UV3310B", manufactured by The Nippon Synthetic Chemical Industry Co., Ltd.; bifunctional): 85 parts by mass;

Phenoxyethyl acrylate (product name: "Viscoat #192", manufactured by Osaka Organic Chemical Industry Ltd.): 5 parts by mass;

A mixture of tripentaerythritol acrylate, mono- and dipentaerythritol acrylate, and polypentaerythritol acrylate (product name: "Viscoat #802"; manufactured by Osaka Organic Chemical Industry Ltd.): 10 parts by mass;

Polymerization initiator (1-hydroxycyclohexyl phenyl ketone; product name: "Irgacure®184", manufactured by BASF Japan Ltd.): 5 parts by mass;

Methyl isobutyl ketone: 10 parts by mass.

(Resin Layer Composition 2)

Urethane acrylate (product name: "UV3310B", manufactured by The Nippon Synthetic Chemical Industry Co., Ltd.; bifunctional): 85 parts by mass;

Phenoxyethyl acrylate (product name: "Viscoat #192", manufactured by Osaka Organic Chemical Industry Ltd.): 15 parts by mass;

Polymerization initiator (1-hydroxycyclohexyl phenyl ketone; product name: "Irgacure®184", manufactured by BASF Japan Ltd.): 5 parts by mass;

Methyl isobutyl ketone: 10 parts by mass.

(Resin Layer Composition 3)

Urethane acrylate (product name: "UV3310B", manufactured by The Nippon Synthetic Chemical Industry Co., Ltd.; bifunctional): 80 parts by mass;

Phenoxyethyl acrylate (product name: "Viscoat #192"; manufactured by Osaka Organic Chemical Industry Ltd.): 5 parts by mass;

A mixture of tripentaerythritol acrylate, mono- and di-pentaerythritol acrylate, and polypentaerythritol acrylate (product name: "Viscoat #802"; manufactured by Osaka Organic Chemical Industry Ltd.): 10 parts by mass;

A mixture of dipentaerythritol pentaacrylate and dipentaerythritol hexaacrylate (product name: "KAYARAD DPHA"; manufactured by Nippon Kayaku Co., Ltd.): 5 parts by mass;

Polymerization initiator (1-hydroxycyclohexyl phenyl ketone; product name: "Irgacure®184", manufactured by BASF Japan Ltd.): 5 parts by mass;

Methyl isobutyl ketone: 10 parts by mass.

(Resin Layer Composition 4)

Urethane acrylate (product name: "UV3310B", manufactured by The Nippon Synthetic Chemical Industry Co., Ltd.; bifunctional): 95 parts by mass;

Phenoxyethyl acrylate (product name: "Viscoat #192"; manufactured by Osaka Organic Chemical Industry Ltd.): 5 parts by mass;

Polymerization initiator (1-hydroxycyclohexyl phenyl ketone; product name: "Irgacure®184", manufactured by BASF Japan Ltd.): 5 parts by mass;

Methyl isobutyl ketone: 10 parts by mass.

Urethane acrylate (product name: "UV3310B", manufactured by The Nippon Synthetic Chemical Industry Co., Ltd.; bifunctional): 85 parts by mass;

A mixture of dipentaerythritol pentaacrylate and dipentaerythritol hexaacrylate (product name: "KAYARAD DPHA"; manufactured by Nippon Kayaku Co., Ltd.): 15 parts by mass;

Polymerization initiator (1-hydroxycyclohexyl phenyl ketone; product name: "Irgacure®184", manufactured by BASF Japan Ltd.): 5 parts by mass;

Methyl isobutyl ketone: 10 parts by mass.

Example 1

A polyimide base material (product name: "Neopulim®"; manufactured by Mitsubishi Gas Chemical Company, Inc.) with a size of 210 mm×297 mm (corresponding to the A4 size) and a thickness of 50 µm was set up as a light-transmitting base material. The Neopulim® used in Examples and Comparative Examples is a commercially available polyimide film. The hard coat layer composition 1 was applied with a bar coater on a first surface of the polyimide base material to form a coating film. Then, the resulting coating film was heated at 70° C. for 1 minute to evaporate the solvent in the coating film, and was then exposed to ultraviolet light to a cumulative light dose of 100 mJ/cm$^2$ in the air by using an ultraviolet irradiation device (with an H bulb as a light source; manufactured by Fusion UV Systems Inc.) to obtain a semi-cured (half cured) coating film. Next, the hard coat layer composition 2 was applied with a bar coater on the surface of the semi-cured coating film of the hard coat layer composition 1 to form a coating film. The resulting coating film was heated at 70° C. for 1 minute to evaporate the solvent in the coating film, and was then exposed to ultraviolet light to a cumulative light dose of 200 mJ/cm$^2$ under an oxygen concentration of 200 ppm or lower by using an ultraviolet irradiation device (with an H bulb as a light source; manufactured by Fusion UV Systems Inc.) to obtain a completely cured (full-cured) coating film. Thus, a hard coat layer composed of a first hard coat layer having a film thickness of 10 µm and placed on the polyimide base material and a second hard coat layer having a film thickness of 5 µm and overlaid on the first hard coat layer was formed.

After the hard coat layer was formed on the polyimide base material, the resin layer composition 1 was applied with a bar coater on a second surface of the polyimide base material to form a coating film. Then, the resulting coating film was heated at 70° C. for 1 minute to evaporate the solvent in the coating film, and was then exposed to ultraviolet light to a cumulative light dose of 1,200 mJ/cm$^2$ in the air by using an ultraviolet irradiation device (with an H bulb as a light source; manufactured by Fusion UV Systems Inc.) to cure the coating film, and a resin layer having a film thickness of 200 µm and composed of the urethane resin was thereby formed.

After the resin layer was formed, MRX-HF Screen Ink (manufactured by Teikoku Printing Inks Mfg. Co. Ltd.) as a decorative layer composition was applied on the surface of the resin layer by a screen-printing technique, and the resulting coating film was heated at 80° C. for 30 minutes to form a frame-shaped decorative layer with a film thickness of 10 µm, and an optical film was thereby obtained.

The thickness of the polyimide base material was defined as the arithmetic mean of thickness values measured at 20 different locations, where a cross-section of the polyimide base material was imaged using a scanning electron microscope (SEM) and the thickness of the polyimide base material was measured at the 20 locations within the image of the cross-section. Specifically, the method of acquiring cross-sectional images was as follows. First of all, a piece of 1 mm×10 mm cut out from the optical film was embedded in an embedding resin to prepare a block, and homogeneous sections having a thickness of 70 nm or more and 100 nm or less and having no openings or the like were cut out from the block according to a commonly used sectioning technique. For the preparation of sections, an Ultramicrotome EM UC7 from Leica Microsystems GmbH was used. Then, the block remaining after slicing the sections was used as a measurement sample. Subsequently, cross-sectional images of the measurement sample were acquired using a scanning electron microscope (SEM) (product name: "S-4800"; manufactured by Hitachi High-Technologies Corporation). The cross-sectional images were acquired using the above-described S-4800 by setting the detector to "SE," the accelerating voltage to "5 kV," and the emission current to "10 µA." The focus, contrast, and brightness were appropriately adjusted at a magnification of 100 to 100,000 times, so that each layer can be identified by observation. Furthermore, the beam monitor aperture, the objective lens aperture, and the WD were set to "3," "3," and "8 mm," respectively. The film thickness of the resin layer was also measured in the same manner as the thickness of the polyimide base material. Also in other Examples and Comparative Examples, the thickness of each polyimide base material and the film thickness of each resin layer were measured in the same manner as in Example 1.

The film thickness of the hard coat layer was defined as the arithmetic mean of film thickness values measured at 20 different locations, where a cross-section of the hard coat layer was imaged using a scanning transmission electron microscope (STEM) (product name: "S-4800"; manufactured by Hitachi High-Technologies Corporation) and the thickness of the hard coat layer was measured at the 20 locations within the image of the cross-section. The cross-section of the hard coat layer was imaged in the below-mentioned manner. First of all, the above-prepared homogeneous sections having no openings or the like were used as measurement samples. Then, cross-sectional images of the measurement sample were acquired using a scanning transmission electron microscope (STEM). The cross-sectional images were acquired by setting the detector to "TE," the accelerating voltage to "30 kV," and the emission current to "10 µA" in the STEM observation. The focus, contrast, and brightness were appropriately adjusted at a magnification of 5000 to 200,000 times, so that each layer could be identified by observation. Furthermore, the beam monitor aperture, the objective lens aperture, and the WD were respectively set to "3," "3," and "8 mm," in acquirement of cross-sectional images. Additionally, the film thicknesses of the resin layer and the decorative layer were measured in the same manner as the film thickness of the hard coat layer. Furthermore, also in other Examples and Comparative Examples, the film thicknesses of each hard coat layer, each resin layer, and each decorative layer were measured in the same manner as in Example 1.

Example 2

In Example 2, an optical film was obtained in the same manner as in Example 1, except that the resin layer composition 2 was used instead of the resin layer composition 1.

Example 3

In Example 3, an optical film was obtained in the same manner as in Example 1, except that the resin layer composition 3 was used instead of the resin layer composition 1.

Example 4

In Example 4, an optical film was obtained in the same manner as in Example 1, except that the film thickness of the resin layer was 15 µm.

Example 5

In Example 5, an optical film was obtained in the same manner as in Example 1, except that the film thickness of the resin layer was 100 µm.

Example 6

A polyimide base material (product name: "Neopulim®"; manufactured by Mitsubishi Gas Chemical Company, Inc.) with a size of 210 mm×297 mm (corresponding to the A4 size) and a thickness of 50 µm was set up as a light-transmitting base material, and the hard coat layer composition 1 was applied with a bar coater on a first surface of the polyimide base material to form a coating film. Then, the resulting coating film was heated at 70° C. for 1 minute to evaporate the solvent in the coating film, and was then exposed to ultraviolet light to a cumulative light dose of 1,200 mJ/cm² in the air by using an ultraviolet irradiation device (with an H bulb as a light source; manufactured by Fusion UV Systems Inc.) to cure the coating film, and a resin layer having a film thickness of 200 µm and composed of the urethane resin was thereby formed.

After the resin layer was formed on the polyimide base material, the hard coat layer composition 1 was applied with a bar coater on the surface of the resin layer to form a coating film. Then, the resulting coating film was heated at 70° C. for 1 minute to evaporate the solvent in the coating film, and was then exposed to ultraviolet light to a cumulative light dose of 100 mJ/cm² in the air by using an ultraviolet irradiation device (with an H bulb as a light source; manufactured by Fusion UV Systems Inc.) to obtain a semi-cured (half cured) coating film. Next, the hard coat layer composition 2 was applied with a bar coater on the surface of the semi-cured coating film of the hard coat layer composition 1 to form a coating film. The resulting coating film was heated at 70° C. for 1 minute to evaporate the solvent in the coating film, and was then exposed to ultraviolet light to a cumulative light dose of 200 mJ/cm² under an oxygen concentration of 200 ppm or lower by using an ultraviolet irradiation device (with an H bulb as a light source; manufactured by Fusion UV Systems Inc.) to obtain a completely cured (full-cured) coating film. Thus, a hard coat layer composed of a first hard coat layer having a film thickness of 10 µm and placed on the polyimide base material and a second hard coat layer having a film thickness of 5 µm and overlaid on the first hard coat layer was formed.

After the hard coat layer was formed on the polyimide base material, the decorative layer composition 1 was applied on a second surface of the polyimide base material by a screen-printing technique, and the resulting coating film was heated at 80° C. for 30 minutes to form a frame-shaped decorative layer with a film thickness of 10 µm, and an optical film was thereby obtained.

Example 7

A polyimide base material (product name: "Neopulim®"; manufactured by Mitsubishi Gas Chemical Company, Inc.) with a size of 210 mm×297 mm (corresponding to the A4 size) and a thickness of 50 µm was set up as a light-transmitting base material, and the hard coat layer composition 1 was applied with a bar coater on a first surface of the polyimide base material to form a coating film. Then, the resulting coating film was heated at 70° C. for 1 minute to evaporate the solvent in the coating film, and was then exposed to ultraviolet light to a cumulative light dose of 100 mJ/cm² in the air by using an ultraviolet irradiation device (with an H bulb as a light source; manufactured by Fusion UV Systems Inc.) to obtain a semi-cured (half cured) coating film. Next, the hard coat layer composition 2 was applied with a bar coater on the surface of the semi-cured coating film of the hard coat layer composition 1 to form a coating film. The resulting coating film was heated at 70° C. for 1 minute to evaporate the solvent in the coating film, and was then exposed to ultraviolet light to a cumulative light dose of 200 mJ/cm² under an oxygen concentration of 200 ppm or lower by using an ultraviolet irradiation device (with an H bulb as a light source; manufactured by Fusion UV Systems Inc.) to obtain a completely cured (full-cured) coating film. Thus, a hard coat layer composed of a first hard coat layer having a film thickness of 10 µm and placed on the polyimide base material and a second hard coat layer having a film thickness of 5 μm and overlaid on the first hard coat layer was formed.

After the hard coat layer was formed on the polyimide base material, the decorative layer composition 1 was applied on a second surface of the polyimide base material by a screen-printing technique, and the resulting coating film was heated at 80° C. for 30 minutes to form a frame-shaped decorative layer with a film thickness of 10 μm.

After the decorative layer was formed, the resin layer composition 1 was applied with a bar coater on the surface of the decorative layer and on the second surface of the polyimide base material to form a coating film. Then, the resulting coating film was heated at 70° C. for 1 minute to evaporate the solvent in the coating film, and was then exposed to ultraviolet light to a cumulative light dose of 1,200 mJ/cm$^2$ in the air by using an ultraviolet irradiation device (with an H bulb as a light source; manufactured by Fusion UV Systems Inc.) to cure the coating film, and a resin layer having a film thickness of 200 μm and composed of the urethane resin was thereby formed, and an optical film was consequently obtained.

Example 8

In Example 8, a one-side primer coated polyethylene terephthalate (PET) film (product name: "Cosmoshine® A4100", manufactured by TOYOBO Co., Ltd.) with a thickness of 100 μm was first set up as a mold release film, instead of the polyimide base material, and the resin layer composition 1 was applied with a bar coater on the uncoated surface of the PET film to form a coating film. Then, the resulting coating film was heated at 70° C. for 1 minute to evaporate the solvent in the coating film, and was then exposed to ultraviolet light to a cumulative light dose of 1,200 mJ/cm$^2$ in the air by using an ultraviolet irradiation device (with an H bulb as a light source; manufactured by Fusion UV Systems Inc.) to cure the coating film, and a resin layer having a film thickness of 200 μm and composed of the urethane resin was thereby formed.

After the resin layer was formed on the PET film, the hard coat layer composition 1 was applied with a bar coater on the surface of the resin layer to form a coating film. Then, the resulting coating film was heated at 70° C. for 1 minute to evaporate the solvent in the coating film, and was then exposed to ultraviolet light to a cumulative light dose of 100 mJ/cm$^2$ in the air by using an ultraviolet irradiation device (with an H bulb as a light source; manufactured by Fusion UV Systems Inc.) to obtain a semi-cured (half cured) coating film. Next, the hard coat layer composition 2 was applied with a bar coater on the surface of the semi-cured coating film of the hard coat layer composition 1 to form a coating film. The resulting coating film was heated at 70° C. for 1 minute to evaporate the solvent in the coating film, and was then exposed to ultraviolet light to a cumulative light dose of 200 mJ/cm$^2$ under an oxygen concentration of 200 ppm or lower by using an ultraviolet irradiation device (with an H bulb as a light source; manufactured by Fusion UV Systems Inc.) to obtain a completely cured (full-cured) coating film. Thus, a hard coat layer composed of a first hard coat layer having a film thickness of 10 μm and placed on the resin layer and a second hard coat layer having a film thickness of 5 μm and overlaid on the first hard coat layer was formed.

After the hard coat layer was formed, the PET film was peeled off to expose the surface of the resin layer. Then, the decorative layer composition 1 was applied on the exposed surface of the resin layer by a screen-printing technique, and the resulting coating film was heated at 80° C. for 30 minutes to form a frame-shaped decorative layer with a film thickness of 10 μm, and an optical film was thereby obtained.

Example 9

In Example 9, an optical film was first obtained in the same manner as in Example 1, except that a decorative layer was not provided to the optical film. Then, a smartphone (product name: "Galaxy S7 edge"; manufactured by Samsung Electronics Co., Ltd.) was divided into parts, from which a circularly polarizing plate and an OLED panel were recovered. Subsequently, a piece of the optical film was cut to a size of 50 mm×50 mm, and the OLED panel, the circularly polarizing plate, and the cut piece of the optical film were overlaid in this order to yield an image display device. The optical film was overlaid in such a manner that the hard coat layer was uppermost in the image display device.

Example 10

In Example 10, an optical film was first obtained in the same manner as in Example 9, except that the resin layer composition 2 was used instead of the resin layer composition 1. Then, the obtained optical film was used in the same manner as in Example 9 to obtain an image display device.

Example 11

In Example 11, an optical film was first obtained in the same manner as in Example 9, except that the resin layer composition 3 was used instead of the resin layer composition 1. Then, the obtained optical film was used in the same manner as in Example 9 to obtain an image display device.

Example 12

In Example 12, an optical film was first obtained in the same manner as in Example 9, except that the film thickness of the resin layer was 15 μm. Then, the obtained optical film was used in the same manner as in Example 9 to obtain an image display device.

Example 13

In Example 13, an optical film was first obtained in the same manner as in Example 9, except that the film thickness of the resin layer was 100 μm. Then, the obtained optical film was used in the same manner as in Example 9 to obtain an image display device.

Example 14

In Example 14, an optical film was first obtained in the same manner as in Example 6, except that a decorative layer was not provided to the optical film. Then, the obtained optical film was used in the same manner as in Example 9 to obtain an image display device.

Example 15

In Example 15, an optical film was first obtained in the same manner as in Example 8, except that a decorative layer was not provided to the optical film. Then, the obtained optical film was used in the same manner as in Example 9 to obtain an image display device.

Example 16

In Example 16, an image display device was obtained in the same manner as in Example 9, except that an ultra-drawn polyethylene terephthalate film (ultra-drawn PET film) cut to a size of 50 mm×50 mm was placed as a light-transmitting film between the circularly polarizing plate and the optical film. The ultra-drawn PET film was located in such a manner that the angle between the slow axis of the ultra-drawn PET film and the absorption axis of the circularly polarizing plate-constituting polarizing plate was 45°.

The ultra-drawn PET film was prepared as follows. First, a PET material was melted at 290° C. and was extruded through a film-forming die to form a sheet, which was brought into close contact with a water-cooled rotating rapid-cooling drum to cool it down, and an unstretched film was thereby produced. On a biaxial film stretching tester (Toyo Seiki Seisaku-sho, Ltd.), the unstretched film was pre-heated at 120° C. for 1 minute, stretched at 120° C. to a draw ratio of 4.5, and then stretched to a draw ratio of 1.5 in the direction of 90 degrees to the previous drawing direction to obtain an ultra-drawn PET film with a refractive index nx of 1.70, a refractive index ny of 1.60, a thickness of 80 μm, and an in-plane phase difference of 8,000 nm.

The in-plane phase difference of the ultra-drawn PET film was measured using a phase-difference measuring apparatus (product name: "KOBRA-WR", Oji Scientific Instruments). Specifically, a piece of the ultra-drawn PET film cut to a size of 30 mm×40 mm was used to measure the in-plane phase difference under the following conditions:
(Measurement Conditions)
  Measurement angle: 0°;
  Measurement wavelength: 548.2 nm;
  Assay temperature: 25° C.;
  Relative humidity: 50%.

Example 17

In Example 17, an image display device was obtained in the same manner as in Example 16, except that the amount of the extruded material and the draw ratio in the process of ultra-drawn PET film production were modified to obtain an ultra-drawn PET film with a refractive index nx of 1.69, a refractive index ny of 1.61, a thickness of 44 μm, and an in-plane phase difference of 3,500 nm.

Example 18

In Example 18, an image display device was obtained in the same manner as in Example 16, except that the amount of the extruded material and the draw ratio in the process of ultra-drawn PET film production were modified to obtain an ultra-drawn PET film with a refractive index nx of 1.70, a refractive index ny of 1.60, a thickness of 190 μm, and an in-plane phase difference of 19,000 nm.

Comparative Example 1

In Comparative Example 1, an optical film was obtained in the same manner as in Example 1, except that the resin layer composition 4 was used instead of the resin layer composition 1.

Comparative Example 2

In Comparative Example 2, an optical film was obtained in the same manner as in Example 1, except that the resin layer composition 5 was used instead of the resin layer composition 1.

Comparative Example 3

In Comparative Example 3, an optical film was obtained in the same manner as in Example 1, except that the film thickness of the resin layer was 5 μm.

Comparative Example 4

In Comparative Example 4, an optical film was obtained in the same manner as in Example 6, except that the resin layer composition 4 was used instead of the resin layer composition 1.

Comparative Example 5

In Comparative Example 5, an optical film was obtained in the same manner as in Example 6, except that the resin layer composition 5 was used instead of the resin layer composition 1.

Comparative Example 6

In Comparative Example 6, an optical film was obtained in the same manner as in Example 7, except that the resin layer composition 4 was used instead of the resin layer composition 1.

Comparative Example 7

In Comparative Example 7, an optical film was obtained in the same manner as in Example 7, except that the resin layer composition 5 was used instead of the resin layer composition 1.

Comparative Example 8

In Comparative Example 8, an optical film was obtained in the same manner as in Example 8, except that the resin layer composition 4 was used instead of the resin layer composition 1.

Comparative Example 9

In Comparative Example 9, an optical film was obtained in the same manner as in Example 8, except that the resin layer composition 5 was used instead of the resin layer composition 1.

Comparative Example 10

In Comparative Example 10, an optical film was first obtained in the same manner as in Example 9, except that the resin layer composition 4 was used instead of the resin layer composition 1. Then, the obtained optical film was used in the same manner as in Example 9 to obtain an image display device.

Comparative Example 11

In Comparative Example 11, an optical film was first obtained in the same manner as in Example 9, except that the resin layer composition 5 was used instead of the resin layer composition 1. Then, the obtained optical film was used in the same manner as in Example 9 to obtain an image display device.

Comparative Example 12

In Comparative Example 12, an optical film was first obtained in the same manner as in Example 9, except that the film thickness of the resin layer was 5 μm. Then, the obtained optical film was used in the same manner as in Example 9 to obtain an image display device.

Comparative Example 13

In Comparative Example 13, an optical film was first obtained in the same manner as in Example 14, except that the resin layer composition 4 was used instead of the resin layer composition 1. Then, the obtained optical film was used in the same manner as in Example 9 to obtain an image display device.

Comparative Example 14

In Comparative Example 14, an optical film was first obtained in the same manner as in Example 14, except that the resin layer composition 5 was used instead of the resin layer composition 1. Then, the obtained optical film was used in the same manner as in Example 9 to obtain an image display device.

Comparative Example 15

In Comparative Example 15, an optical film was first obtained in the same manner as in Example 15, except that the resin layer composition 4 was used instead of the resin layer composition 1. Then, the obtained optical film was used in the same manner as in Example 9 to obtain an image display device.

Comparative Example 16

In Comparative Example 16, an optical film was first obtained in the same manner as in Example 15, except that the resin layer composition 5 was used instead of the resin layer composition 1. Then, the obtained optical film was used in the same manner as in Example 9 to obtain an image display device.

<Martens Hardness>

The Martens hardness of a resin layer was measured in each of the optical films according to Examples and Comparative Examples. The Martens hardness was measured using a "TI950 TriboIndenter" manufactured by Hysitron, Inc. Specifically, a piece having a size of 1 mm×10 mm was cut out from the optical film and embedded in an embedding resin to prepare a block, and homogeneous sections having a thickness of 70 nm or more and 100 nm or less and having no openings or the like were cut out from the block according to a commonly used sectioning technique. For the preparation of sections, an Ultramicrotome EM UC7 from Leica Microsystems GmbH was used. Then, the block remaining after slicing the sections was used as a measurement sample. Subsequently, a Berkovich indenter (a trigonal pyramid, TI-0039, manufactured by BRUKER Corporation) as an indenter was pressed into the cross-section of the resin layer to a depth of 500 nm at the center in the cross-section of the measurement sample obtained after cutting out the sections. In this respect, a Berkovich indenter was pressed into the resin layer at a position located 500 nm away from the interface between the polyimide base material and the resin layer toward the center of the resin layer and 500 nm away from both edges of the resin layer toward the center of the resin layer, in order to avoid the influence of the side edges of the polyimide base material and the resin layer. Subsequently, the intender was held at the position for a certain period of time to relax the residual stress, and then unloaded to measure the maximum load after the relaxation, and the maximum load $P_{max}$ (μN) and the area A (nm$^2$) of a depression with a depth of 500 nm were used to calculate a Martens hardness from the value of $P_{max}/A$. The Martens hardness was defined as the arithmetic mean of values measured at 10 different locations. In cases where a measured value which fell outside the arithmetic mean plus and minus 20% was included in the measured values, the measured value was to be excluded to repeat the measurement again. Whether or not a measured value which fell outside the arithmetic mean plus and minus 20% was included in the measured values was determined by whether or not a value (%) obtained by the formula (A−B)/B×100 equaled or exceeded ±20%, where A represents a measured value and B represents the arithmetic mean.

(Measurement Conditions)
   Loading speed: 10 nm/sec
   Dwell time: 5 sec
   Unloading speed: 10 nm/sec
   Assay temperature: 25° C.
   Relative humidity: 50%

<Impact Resistance Test 1>

Each of the optical films according to Examples 1 to 8 and Comparative Examples 1 to 9 was used to perform impact resistance tests in the environment with a temperature of 25° C. and a relative humidity of 50% or less. Specifically, the impact resistance test (1) was performed three times on each of the optical films according to Examples 1 to 7 and Comparative Examples 1 to 9, in which each optical film was directly placed on the surface of a soda-lime glass with a thickness of 0.7 mm in such a manner that the hard coat layer of the optical film was positioned uppermost, and a 100-g iron ball with a diameter of 30 mm was dropped from 30 cm above the surface of the hard coat layer. Additionally, the impact resistance test (2) was performed three times on each of the optical films according to Examples 1 to 8 and Comparative Examples 1 to 9, in which each optical film was placed through an adhesive sheet with a thickness of 200 μm (product name: "Optically Clear Adhesive 8146-2"; manufactured by 3M Company) on a soda-lime glass with a thickness of 0.7 mm in such a manner that the hard coat layer of the optical film was positioned uppermost, and a 100-g iron ball with a diameter of 30 mm was dropped from 30 cm above the surface of the hard coat layer. However, the iron ball was dropped to a position on the surface of the hard coat layer, below which there existed the decorative layer. In the impact resistance tests (1) and (2), the position to which the iron ball was dropped was to be changed each time when the ball was dropped. Then, each optical film after the impact resistance test (1) was visually evaluated for the presence of any depression on the surface of the hard coat layer, any crack in the soda-lime glass, and any crack in the decorative layer. Additionally, each optical film after the impact resistance test (2) was visually evaluated for the presence of any depression on the surface of the hard coat layer. The evaluation results were based on the following evaluation criteria.

(Evaluation of a Depression on the Surface of a Hard Coat Layer)

⊙: no depression was identified on the surface of a hard coat layer in both cases where the hard coat layer was observed in the perpendicular direction and in the diagonal direction;

○: a depression was identified on the surface of a hard coat layer in either of the cases where the hard coat layer was observed in the perpendicular direction and in the diagonal direction, but the depression was not so serious as to warrant exclusion from practical use;

Δ: no depression was identified on the surface of a hard coat layer in a case where the hard coat layer was observed in the perpendicular direction, while a depression was identified on the surface of the hard coat layer in a case where the hard coat layer was observed in the diagonal direction;

x: an obvious depression was identified on the surface of a hard coat layer in both cases where the hard coat layer was observed in the perpendicular direction and in the diagonal direction.

(Evaluation of a Crack in a Soda-Lime Glass)

⊙: no crack was formed in a soda-lime glass;

○: there was no crack but a scratch formed in a soda-lime glass;

Δ: the formation of crack in a soda-lime glass was observed in one or two trials;

x: the formation of crack in a soda-lime glass was observed in all the three trials.

(Evaluation of a Crack in a Decorative Layer)

⊙: no crack was found in a decorative layer;

○: a slight crack was found in a decorative layer, but the crack was not so serious as to warrant exclusion from practical use;

x: a crack was found in a decorative layer.

<Impact Resistance Test 2>

Each of the image display devices according to Examples 9 to 18 and Comparative Examples 10 to 16 was used to perform an impact resistance test in the environment with a temperature of 25° C. and a relative humidity of 50% or less. Specifically, the impact resistance test was performed three times, in which a 100-g iron ball with a diameter of 30 mm was dropped from 30 cm above the surface of each image display device (the surface of the hard coat layer in each optical film). However, the iron ball was dropped to a position on the surface of the hard coat layer, below which there existed the decorative layer. In the impact resistance test, the position to which the iron ball was dropped was to be changed each time when the ball was dropped. Then, each optical film after the impact resistance test was visually evaluated for the presence of any depression on the surface of the hard coat layer and any crack in the circularly polarizing plate. The evaluation results were based on the following evaluation criteria.

(Evaluation of a Depression on the Surface of a Hard Coat Layer)

⊙: no depression was identified on the surface of a hard coat layer in both cases where the hard coat layer was observed in the perpendicular direction and in the diagonal direction;

○: a depression was identified on the surface of a hard coat layer in either of the cases where the hard coat layer was observed in the perpendicular direction and in the diagonal direction, but the depression was not so serious as to warrant exclusion from practical use;

Δ: no depression was identified on the surface of a hard coat layer in a case where the hard coat layer was observed in the perpendicular direction, while a depression was identified on the surface of the hard coat layer in a case where the hard coat layer was observed in the diagonal direction;

x: an obvious depression was identified on the surface of a hard coat layer in both cases where the hard coat layer was observed in the perpendicular direction and in the diagonal direction.

(Evaluation of a Crack in a Circularly Polarizing Plate)

⊙: none of the following was found in a circularly polarizing plate: a crack, a deformation, and a breakage, and no light leakage was observed;

○: at least any of the following was found in a circularly polarizing plate: a slight crack, a slight deformation, and a slight breakage, but no light leakage was observed;

x: at least any of the following was found in a circularly polarizing plate: a crack, a deformation, and a breakage, and light leakage was observed.

<Successive Folding Test>

A successive folding test was performed on each of the optical films according to Examples and Comparative Examples in the environment with a temperature of 25° C. and a relative humidity of 50% or less to evaluate the foldability. Specifically, a piece of each optical film was first cut to a size of 30 mm×100 mm and was mounted to an endurance testing machine (product name: "DLDMLH-FS"; manufactured by Yuasa System Co., Ltd.) by fixing the short edges of the optical film to fixing members, as shown in FIG. 2(C), in such a manner that the minimum gap distance φ between the two opposing edges was 30 mm, and the piece of the optical film was folded one hundred thousand times in the successive folding test, in such a manner the front surface of the optical film (the surface of the hard coat layer) faced inward, to examine whether any crack or break was formed at the bent part. Additionally, a new piece of each optical film was similarly cut to a size of 30 mm×100 mm and was mounted to an endurance testing machine (product name: "DLDMLH-FS"; manufactured by Yuasa System Co., Ltd.) by fixing the short edges of the optical film to fixing members in such a manner that the minimum gap distance between the two opposing edges was 10 mm, and the piece of the optical film was folded one hundred thousand times in the successive folding test, in such a manner that the front surface of the optical film faced inward, to examine whether any crack or break was formed at the bent part. The evaluation criteria were as follows.

(Foldability)

⊙: no crack or break was formed at the bent part in the successive folding tests;

○: a slight crack or break was formed at the bent part in the successive folding tests, but the damage was not so serious as to warrant exclusion from practical use;

x: a crack or a break was evidently formed at the bent part in the successive folding tests.

<Evaluation of Colorful Interference Pattern Formation>

Each of the image display devices according to Examples 9 and 16 to 18 was used to evaluate colorful interference pattern formation. Specifically, an image on the display was observed in the perpendicular direction and in an oblique direction (with about 50 degrees) by naked eyes or through polarized sunglasses in the dark or in the light (with an illuminance of 400 lux near an image display device) with turning on the OLED panel of each image display device, to evaluate the presence or absence of a colorful interference pattern based on the following criteria. The observation through polarized sunglasses as an evaluation method is stricter than the observation by naked eyes. The observation was performed by 10 examiners, and an evaluation at which the largest number of examiners agreed was considered as the observation result.

⊙: no colorful interference pattern was observed not only by naked eyes, but also through polarized sunglasses;

○: a faint colorful interference pattern was observed through polarized sunglasses, but no colorful interference pattern was observed by naked eyes, and the pattern was not so serious as to warrant exclusion from practical use;

Δ: a colorful interference pattern was observed through polarized sunglasses, and a very faint colorful interference pattern was observed by naked eyes;

x: an intense colorful interference pattern was observed through polarized sunglasses, and a colorful interference pattern was also observed by naked eyes.

The results are shown in Tables 1 and 2 below.

TABLE 1

| | Resin layer | | Impact resistance test 1-(1) | | | Impact resistance test 1-(2) | | |
|---|---|---|---|---|---|---|---|---|
| | Film thickness (μm) | Martens hardness (MPa) | Depression on hard coat layer surface | Crack in soda-lime glass | Crack in decorative layer | Depression on hard coat layer surface | Successive folding test 30 mm | 10 mm |
| Example 1 | 200 | 61 | ⊙ | ⊙ | ⊙ | ⊙ | ⊙ | ○ |
| Example 2 | 200 | 35 | ⊙ | ⊙ | ⊙ | ⊙ | ⊙ | ○ |
| Example 3 | 200 | 82 | ○ | ○ | ⊙ | ○ | ⊙ | ○ |
| Example 4 | 15 | 72 | ○ | ○ | ⊙ | ○ | ⊙ | ⊙ |
| Example 5 | 100 | 61 | ⊙ | ○ | ○ | ⊙ | ⊙ | ⊙ |
| Example 6 | 200 | 64 | ⊙ | ⊙ | ⊙ | ⊙ | ⊙ | ○ |
| Example 7 | 200 | 62 | ⊙ | ⊙ | ○ | ⊙ | ⊙ | ⊙ |
| Example 8 | 200 | 56 | ○ | ○ | ○ | ○ | ⊙ | ⊙ |
| Comparative Example 1 | 200 | 0.5 | X | X | X | X | ⊙ | ⊙ |
| Comparative Example 2 | 200 | 123 | ⊙ | ⊙ | ⊙ | ⊙ | X | X |
| Comparative Example 3 | 5 | 82 | ○ | X | X | ○ | ⊙ | ⊙ |
| Comparative Example 4 | 200 | 0.4 | X | X | X | X | ⊙ | ⊙ |
| Comparative Example 5 | 200 | 115 | ⊙ | ⊙ | ⊙ | ⊙ | X | X |
| Comparative Example 6 | 200 | 0.4 | X | X | X | X | ⊙ | ⊙ |
| Comparative Example 7 | 200 | 120 | ⊙ | ⊙ | ○ | ⊙ | X | X |
| Comparative Example 8 | 200 | 0.4 | X | X | X | X | ⊙ | ⊙ |
| Comparative Example 9 | 200 | 131 | ○ | ○ | ○ | ○ | X | X |

TABLE 2

| | Resin layer | | Impact resistance test 2 | | Successive folding test | | Evaluation of colorful interference pattern formation |
|---|---|---|---|---|---|---|---|
| | Film thickness (μm) | Film thickness (μm) | Depression on hard coat layer surface | Crack or the like in circularly polarizing plate | 30 mm | 10 mm | |
| Example 9 | 200 | 62 | ⊙ | ⊙ | ⊙ | ○ | Δ |
| Example 10 | 200 | 37 | ⊙ | ⊙ | ⊙ | ○ | — |
| Example 11 | 200 | 85 | ○ | ○ | ⊙ | ○ | — |
| Example 12 | 15 | 77 | ○ | ○ | ⊙ | ⊙ | — |
| Example 13 | 100 | 61 | ⊙ | ○ | ⊙ | ⊙ | — |
| Example 14 | 200 | 65 | ⊙ | ⊙ | ⊙ | ○ | — |
| Example 15 | 200 | 63 | ○ | ○ | ⊙ | ⊙ | — |
| Example 16 | 200 | 61 | ⊙ | ⊙ | ⊙ | ⊙ | ⊙ |
| Example 17 | 200 | 61 | ⊙ | ⊙ | ⊙ | ⊙ | ○ |
| Example 18 | 200 | 61 | ⊙ | ⊙ | ⊙ | ⊙ | ⊙ |
| Comparative Example 10 | 200 | 0.4 | X | X | ⊙ | ⊙ | — |
| Comparative Example 11 | 200 | 112 | ⊙ | ⊙ | X | X | — |
| Comparative Example 12 | 5 | 82 | ○ | X | ⊙ | ⊙ | — |
| Comparative Example 13 | 200 | 0.5 | X | X | ⊙ | ⊙ | — |
| Comparative Example 14 | 200 | 119 | ⊙ | ⊙ | X | X | — |

TABLE 2-continued

| | Resin layer | | Impact resistance test 2 | | Successive folding test | | Evaluation of colorful interference pattern formation |
|---|---|---|---|---|---|---|---|
| | Film thickness (μm) | Film thickness (μm) | Depression on hard coat layer surface | Crack or the like in circularly polarizing plate | 30 mm | 10 mm | |
| Comparative Example 15 | 200 | 0.5 | X | X | ⊙ | ⊙ | — |
| Comparative Example 16 | 200 | 132 | ○ | ○ | X | X | — |

The results will be described below. The Martens hardness of each resin layer in the optical films according to Comparative Examples 1, 2, and 4 to 9 fell outside the range from 1 MPa to 100 MPa, and the resin layer in the optical film according to Comparative Example 3 had a film thickness of less than 10 μm, which means that those optical films had poor impact resistance. In contrast, in the optical films according to Examples 1 to 8, the Martens hardness of each resin layer fell within the range from 1 MPa to 100 MPa, and each resin layer had a film thickness of 10 μm or more, which means that those optical films had excellent impact resistance.

Additionally, each of the optical films according to Examples 1 to 6 had a polyimide base material and, furthermore, a resin layer located closer to the front surface of the optical film than a decorative layer, which caused the decorative layer not to form any crack even when subjected to an impact resistance test.

In the optical film according to Example 7, a decorative layer was placed between a polyimide base material and a resin layer, which caused the optical film to have more excellent foldability than those of the optical films according to Examples 1 to 3 and 6, which also had a polyimide base material and a resin layer with the same film thickness.

The Martens hardness of each resin layer in the optical film of each of the image display devices according to Comparative Examples 10, 11, and 13 to 16 fell outside the range from 1 MPa to 100 MPa, and the resin layer of the optical film in the image display device according to Comparative Example 12 had a film thickness of less than 10 μm, which means that those image display devices had poor impact resistance. In contrast, in the image display devices according to Examples 9 to 18, the Martens hardness of each resin layer in each optical film fell within the range from 1 MPa to 100 MPa, and each resin layer had a film thickness of 10 μm or more, which means that those image display devices had excellent impact resistance.

LIST OF REFERENCE NUMERALS

| | |
|---|---|
| 10, 30, 40, 50, 60, 90, 100, 110. | Optical film |
| 10A, 30A, 40A, 50A, 60A, 90A, 100A, 110A. | Front surface |
| 10B, 30B, 40B, 50B, 60B, 90B, 100B, 110B. | Back surface |
| 11. | Light-transmitting base material |
| 11A. | First surface |
| 11B. | Second surface |
| 12. | Hard coat layer |
| 13. | Resin layer |
| 14. | Decorative layer |
| 15. | First hard coat layer |
| 16. | Second hard coat layer |
| 70, 80, 120. | Image display device |
| 73. | Display panel |
| 74. | Polarizing plate |
| 121. | Light-transmitting film |

The invention claimed is:

1. A foldable optical film with a front surface and a back surface opposite to the front surface, comprising:
   a light-transmitting base material, a hard coat layer, a resin layer, and a decorative layer,
   wherein the light-transmitting base material is a base material containing a polyimide resin, a polyamide resin, or a combination thereof;
   the hard coat layer is located closer to the front surface than the resin layer and the decorative layer in the optical film;
   the resin layer has a film thickness of 30 μm or more and 500 μm or less; and
   the resin layer has a Martens hardness of 1 MPa or more and 100 MPa or less.

2. The optical film according to claim 1, wherein the resin layer is provided closer to the front surface than the decorative layer in the optical film.

3. The optical film according to claim 1, comprising the hard coat layer, the light-transmitting base material, the resin layer, and the decorative layer arranged in this order from the front surface to the back surface in the optical film.

4. The optical film according to claim 1, comprising the hard coat layer, the resin layer, the light-transmitting base material, and the decorative layer arranged in this order from the front surface to the back surface in the optical film.

5. The optical film according to claim 1, wherein the decorative layer is provided between the light-transmitting base material and the resin layer.

6. The optical film according to claim 1, wherein the resin layer has a film thickness of 50 μm or more and 500 μm or less.

7. The optical film according to claim 1, wherein no crack or break is formed in the optical film when the optical film is folded in a manner that leaves a gap of 30 mm between the opposite edges, and then unfolded, and the process is repeated one hundred thousand times.

8. An image display device, comprising:
   a display panel; and
   the optical film according to claim 1 placed on the observer's side of the display panel,
   wherein the front surface of the optical film is closer to the observer's side than the back surface of the optical film.

9. The image display device according to claim 8, wherein the display panel is an organic light-emitting diode panel.

10. The optical film according to claim 1, wherein the light-transmitting base material is located closer to the front surface than the decorative layer in the optical film.

11. An image display device, comprising a display panel, a polarizing plate, and a foldable optical film arranged in this order toward the observer's side,
- wherein the optical film comprises a light-transmitting base material, a hard coat layer and a resin layer that is located closer to the polarizing plate than the hard coat layer;
- the light-transmitting base material is a base material containing a polyimide resin, a polyamide resin, or a combination thereof;
- the resin layer has a film thickness of 30 μm or more and 500 μm or less; and
- the resin layer has a Martens hardness of 1 MPa or more and 100 MPa or less.

12. The image display device according to claim 11, comprising the hard coat layer, the light-transmitting base material, and the resin layer arranged in this order toward the polarizing plate.

13. The image display device according to claim 11, comprising the hard coat layer, the resin layer, and the light-transmitting base material arranged in this order toward the polarizing plate.

14. The image display device according to claim 11, wherein the resin layer has a film thickness of 50 μm or more and 500 μm or less.

15. The image display device according to claim 11, further comprising a light-transmitting film with an in-plane phase difference of 3,000 nm or more located closer to the observer's side than the polarizing plate.

16. The image display device according to claim 11, wherein no crack or break is formed in the optical film when the optical film is folded in a manner that leaves a gap of 30 mm between the opposite edges, and then unfolded, and the process is repeated one hundred thousand times.

17. The image display device according to claim 11, wherein the display panel is an organic light-emitting diode panel.

* * * * *